United States Patent
Morishima et al.

(10) Patent No.: US 10,944,054 B2
(45) Date of Patent: Mar. 9, 2021

(54) METHOD FOR MANUFACTURING ORGANIC DEVICE, AND FILM FORMING DEVICE

(71) Applicant: SUMITOMO CHEMICAL COMPANY, LIMITED, Tokyo (JP)

(72) Inventors: Shinichi Morishima, Tsukuba (JP); Eiji Kishikawa, Osaka (JP); Masaya Shimogawara, Niihama (JP)

(73) Assignee: SUMITOMO CHEMICAL COMPANY, LIMITED, Tokyo (JP)

(*) Notice: Subject to any disclaimer, the term of this patent is extended or adjusted under 35 U.S.C. 154(b) by 0 days.

(21) Appl. No.: 16/480,163

(22) PCT Filed: Jan. 5, 2018

(86) PCT No.: PCT/JP2018/000108
§ 371 (c)(1),
(2) Date: Jul. 23, 2019

(87) PCT Pub. No.: WO2018/135323
PCT Pub. Date: Jul. 26, 2018

(65) Prior Publication Data
US 2019/0372003 A1    Dec. 5, 2019

(30) Foreign Application Priority Data
Jan. 23, 2017 (JP) .............. JP2017-009642

(51) Int. Cl.
*H01L 51/40* (2006.01)
*H01L 51/00* (2006.01)
*H01L 51/56* (2006.01)

(52) U.S. Cl.
CPC .......... *H01L 51/0011* (2013.01); *H01L 51/56* (2013.01)

(58) Field of Classification Search
CPC ..... H01L 51/0011; H01L 51/56; H01L 51/50; Y02E 10/549; C23C 14/56; C23C 14/04; H05B 33/10; H05B 33/02
(Continued)

(56) References Cited

U.S. PATENT DOCUMENTS

| 6,579,422 B1 | 6/2003 | Kakinuma |
| 2003/0230238 A1 | 12/2003 | Papadimitrakopoulos et al. |

(Continued)

FOREIGN PATENT DOCUMENTS

| EP | 2 744 305 A1 | 6/2014 |
| JP | 2012-230816 A | 11/2012 |

(Continued)

OTHER PUBLICATIONS

International Preliminary Report on Patentability and the Written Opinion of the International Searching Authority for International Application No. PCT/JP2018/000108, dated Aug. 1, 2019.

(Continued)

*Primary Examiner* — Vu A Vu
(74) *Attorney, Agent, or Firm* — Birch, Stewart, Kolasch & Birch, LLP

(57) ABSTRACT

A method for manufacturing an organic device 10 according to an embodiment includes: a film forming step of continuously forming first to N-th layers (N is an integer of 2 or more) on a first electrode layer 14 formed on a main surface 12a of a flexible substrate while continuously conveying the flexible substrate 12, wherein in the film forming step, the first to N-th layers are sequentially formed on the first electrode layer by supplying materials of the first to N-th layers from first to N-th film forming sources to the flexible substrate through first to N-th shielding parts arranged between the first to N-th film forming sources and the flexible substrate, the first to N-th shielding parts are fixed (Continued)

in a conveyance direction of the flexible substrate in a state of being spaced apart from the flexible substrate, and a shielding area due to at least one shielding part of the first to N-th shielding parts is different from a shielding area due to other shielding part.

15 Claims, 12 Drawing Sheets

(58) Field of Classification Search
USPC .......................................................... 438/99
See application file for complete search history.

(56) References Cited

U.S. PATENT DOCUMENTS

| | | | |
|---|---|---|---|
| 2011/0065282 | A1 | 3/2011 | Yan et al. |
| 2014/0051198 | A1 | 2/2014 | Kakiuchi et al. |
| 2016/0164046 | A1* | 6/2016 | Uezawa ................. H01L 51/50 257/40 |

FOREIGN PATENT DOCUMENTS

| | | |
|---|---|---|
| JP | 2013-504693 A | 2/2013 |
| JP | 2014-120350 A | 6/2014 |
| JP | 2014-214367 A | 11/2014 |
| JP | 5812496 B | 11/2015 |
| JP | 2016-197578 A | 11/2016 |
| WO | WO 01/05194 A1 | 1/2001 |
| WO | WO 2011/021622 A1 | 2/2011 |
| WO | WO 2012/008275 A1 | 1/2012 |
| WO | WO 2013/111600 A1 | 8/2013 |
| WO | WO 2016/158407 A1 | 10/2016 |

OTHER PUBLICATIONS

International Search Report for International Application No. PCT/JP2018/000108 dated Apr. 10, 2018.
Japanese Notice of Reasons for Rejection dated May 19, 2020, for Japanese Application No. 2017-009642, with an English translation.
Japanese Notice of Reasons for Rejection for Japanese Application No. 2017-009642, dated Sep. 8, 2020, with an English translation.
European Patent Office Communication and search report issued in the corresponding European Patent Application No. 18740996.6 dated Sep. 16, 2020.
Chinese Office Action for Application No. 201880008184.2 dated Dec. 22, 2020 with English language translation.

\* cited by examiner

METHOD FOR MANUFACTURING ORGANIC DEVICE, AND FILM FORMING DEVICE

TECHNICAL FIELD

The present invention relates to a method for manufacturing an organic device and a film forming device.

BACKGROUND ART

Examples of an organic device include an organic electroluminescent element (organic EL device), an organic solar cell, an organic transistor, and the like. The organic device includes a first electrode layer, functional layers (for example, a hole injection layer, a light emitting layer, an electron injection layer, and the like in the organic EL device) having a predetermined function, and a second electrode layer, which are provided on a substrate. When the organic device is manufactured, a film forming step is performed in order to form a laminated structure on the first electrode layer. As described in Patent Literature 1, a method using a vacuum film forming method, which is a type of dry film forming method, has been known as an example of the film forming step.

CITATION LIST

Patent Literature

Patent Literature 1: WO 2012/008275A

SUMMARY OF INVENTION

Technical Problem

In the vacuum film forming method, an area other than a film forming area on the substrate needs to be shielded by a shielding part. As this shielding method, for example, a method for aligning a mask as the shielding part and the substrate with each other and bringing the mask into close contact with the substrate to shield a part of the substrate can be considered. In this case, since a film cannot be formed on the substrate while the substrate is continuously conveyed, productivity of the organic device is reduced. Further, since the mask is brought into direct contact with the substrate, damage is generated in the substrate, such that there is a possibility that a desired performance in the organic device cannot be realized.

Therefore, an object of the present invention is to provide a method for manufacturing an organic device and a film forming device capable of having an improved productivity and realizing a desired performance.

Solution to Problem

A method for manufacturing an organic device according to an aspect of the present invention includes: a step of forming a laminated structure on a first electrode layer formed on a main surface of a flexible substrate extending in one direction, the laminated structure including a device functional portion including at least one functional layer and a second electrode layer, wherein the step of forming the laminated structure includes a film forming step of forming first to N-th layers (N is an integer of 2 or more) on the first electrode layer while continuously conveying the flexible substrate on which the first electrode layer is formed, in the film forming step, the first to N-th layers are sequentially formed on the first electrode layer by selectively supplying materials of the first to N-th layers from first to N-th film forming sources to film forming areas for the first to N-th layers while shielding partial areas on the main surface due to first to N-th shielding parts arranged between the first to N-th film forming sources and the flexible substrate, the first to N-th shielding parts are fixed in a conveyance direction of the flexible substrate in a state of being spaced apart from the flexible substrate, and a shielding area on the main surface due to at least one shielding part of the first to N-th shielding parts is different from a shielding area due to at least one other shielding part of the first to N-th shielding parts.

In the method for manufacturing an organic device, in the film forming step, the first to N-th layers can be formed while the flexible substrate is continuously conveyed, and a time required for forming the first to N-th layers can thus be shortened. Since the shielding area of at least one shielding part of the first to N-th shielding parts is different from that of at least one other shielding part of the first to N-th shielding parts, at least one layer of the first to N-th layers can be formed to have a size different from that of at least one other layer of the first to N-th layers. Further, since the first to N-th shielding parts are fixed in the conveyance direction of the flexible substrate, it is more difficult for the materials of the first to N-th layers attached to the first to N-th shielding parts to cause dust or the like as compared with a case of moving the first to N-th shielding parts in the conveyance direction of the flexible substrate and as compared with a case of bringing the flexible substrate and the shielding parts into contact with each other, such that it is possible to manufacture an organic device having a desired performance.

In the film forming step, the first to N-th layers may be formed while the flexible substrate is wound around roll surfaces of first to N-th film forming rolls. The phrase "the flexible substrate is wound around the film forming roll" means a state where the flexible substrate is in contact with a part of the roll surface of the film forming roll so that a longitudinal direction of the flexible substrate and a rotation direction of the film forming roll are directed to the same direction and the flexible substrate covers the film forming roll.

In the film forming step, each of the first to N-th layers may be formed by a dry film forming method.

A shielding area due to a k-th shielding part (2≤k≤N) of the first to N-th shielding parts may be narrower than a shielding area due to a k−1-th shielding part. Therefore, the k-th layer can be formed so as to cover the k−1-th layer.

The first to N-th shielding parts may shield the outside of a function generating design area which is an area that is to form a function generating area of the device functional portion on the flexible substrate. Therefore, the first to N-th layers can be formed so as to include the function generating design area, and the function generating area can thus be certainly secured.

In a direction perpendicular to the main surface of the flexible substrate, a distance Dn between a surface of an n-th shielding part (1≤n≤N) of the first to N-th shielding parts that faces the main surface and the main surface may be 1 to 160 times the thickness of the flexible substrate. If the distance Dn is such a distance, it is easy to prevent contact between the conveyed flexible substrate and first to N-th shielding plates. If the distance Dn is such a distance, it is easy to realize shielding effects due to the first to N-th shielding parts, and it is thus possible to reduce an area (blur amount) in which the materials of the first to N-th layers intrude between the first to N-th shielding parts and the main surface to be deposited outside the film forming areas for the first to N-th layers.

In the direction perpendicular to the main surface of the flexible substrate, assuming that a maximum value of the distance Dn between the surface of the n-th shielding part ($1 \leq n \leq N$) of the first to N-th shielding parts that faces the main surface and the main surface is Dn and a minimum value of the distance Dn is $Dn_{min}$, $Dn_{max}$ and $Dn_{min}$ may satisfy the following Equation:

$$\{(Dn_{max}-Dn_{min})/((Dn_{max}+Dn_{min})/2)\} \times 100 \leq 40.$$

Accordingly, the first to N-th layers can be formed with a higher position accuracy in the film forming areas for the first to N-th layers, respectively.

A predetermined shielding part of the first to N-th shielding parts may have a plurality of shielding plates in a width direction of the flexible substrate, and the plurality of shielding plates may be spaced apart from each other. In this case, a material passing between adjacent shielding plates can be selectively supplied onto the flexible substrate. In the above case, it is easy to adjust the shielded area.

The film forming step may include a step of adjusting a shielding area by moving at least one of the plurality of shielding plates in the width direction of the flexible substrate. Therefore, it is possible to form a predetermined layer formed using predetermined shielding plates among the first to N-th layers more accurately in a film forming area for the predetermined layer.

The film forming step may include a step of acquiring reference positional information of the flexible substrate before the step of adjusting the shielding area, and in the step of adjusting the shielding area, the shielding area may be adjusted on the basis of the reference positional information. Therefore, it is possible to form a predetermined layer formed using a predetermined shielding part among the first to N-th layers more accurately in a film forming area for the predetermined layer.

The film forming step may include a step of acquiring end portion positional information which is positional information of an end portion of a layer formed through the predetermined shielding part or a layer formed through a shielding part upstream of the predetermined shielding part, and after the step of acquiring the end portion positional information, a step of adjusting a shielding area of the predetermined shielding part on the basis of the end portion positional information may be performed. Therefore, it is possible to form a predetermined layer formed using predetermined shielding plates among the first to N-th layers more accurately in a film forming area for the predetermined layer.

A film forming device according to another aspect of the present invention is a film forming device that forms first to N-th layers (N is an integer of 2 or More) on a flexible substrate extending in one direction while the flexible substrate is continuously conveyed, the film forming device including: first to N-th film forming sources arranged to be spaced apart from the flexible substrate and configured to supply materials of the first to N-th layers onto the flexible substrate; and first to N-th shielding parts being spaced apart from the flexible substrate, provided between the first to N-th film forming sources and the flexible substrate, and configured to shield a part of the supply of the materials of the first to N-th layers from the first to N-th film forming sources onto the flexible substrate, wherein the first to N-th film forming sources are sequentially arranged from an upstream side to a downstream side in a conveyance direction of the flexible substrate, the first to N-th shielding parts are fixed in the conveyance direction of the flexible substrate, and a shielding area of at least one shielding part of the first to N-th shielding parts is different from that of at least one other shielding part of the first to N-th Shielding parts.

In the film forming device, since the shielding area of at least one shielding part of the first to N-th shielding parts is different from that of at least one other shielding part of the first to N-th shielding parts, at least one layer of the first to N-th layers can be formed to have a size different from that of at least one other layer of the first to N-th layers. Since the first to N-th shielding parts are provided to be spaced apart from the flexible substrate, it is possible to form the first to N-th layers while continuously conveying the flexible substrate without damaging the flexible substrate. Therefore, by using the film forming device for forming a plurality of layers in the method of manufacturing an organic device, it is possible to manufacture an organic device having an improved productivity and a desired performance.

A film forming device according to an embodiment may further include first to N-th film forming rolls (N is an integer of 2 or more) arranged to face the first to N-th film forming sources, respectively, and having roll surfaces around which the flexible substrate is wound. In this case, it is possible to form the first to N-th layers while continuously winding the flexible substrate around the first to N-th film forming rolls.

A film forming device according to an embodiment may further include a shielding area adjusting mechanism provided for a predetermined shielding part of the first to N-th shielding parts and configured to adjust a shielding area due to the predetermined shielding part in a width direction of the flexible substrate, wherein the predetermined shielding part has a plurality of shielding plates arranged to be spaced apart from each other in an axial direction of a corresponding film forming roll, and the shielding area adjusting mechanism moves at least one of the plurality of shielding plates in the width direction of the flexible substrate. Therefore, it is possible to form a predetermined layer formed using predetermined shielding plates among the first to N-th layers more accurately in a film forming area for the predetermined layer.

A film forming device according to an embodiment may further include a reference positional information acquiring part configured to acquire reference positional information of the flexible substrate, wherein the shielding area adjusting mechanism adjusts the shielding area of the predetermined shielding part on the basis of the reference positional information acquired by the reference positional information acquiring part. Therefore, it is possible to form a predetermined layer formed using predetermined shielding plates among the first to N-th layers more accurately in a film forming area for the predetermined layer.

A film forming device according to an embodiment may further include an end portion positional information acquiring part configured to acquire end portion positional information which is positional information of an end portion of a layer formed through the predetermined shielding part or a layer formed through a shielding part upstream of the predetermined shielding part, wherein the shielding area adjusting mechanism adjusts the shielding area of the predetermined shielding part on the basis of the end portion positional information acquired by the end portion positional information acquiring part. Therefore, it is possible to form a predetermined layer formed using predetermined shielding plates among the first to N-th layers more accurately in a film forming area for the predetermined layer.

Advantageous Effects of Invention

According to the present invention, it is possible to provide a method for manufacturing an organic device and a film forming device capable of having an improved productivity and realizing a desired performance.

DESCRIPTION OF EMBODIMENTS

Figure 1:
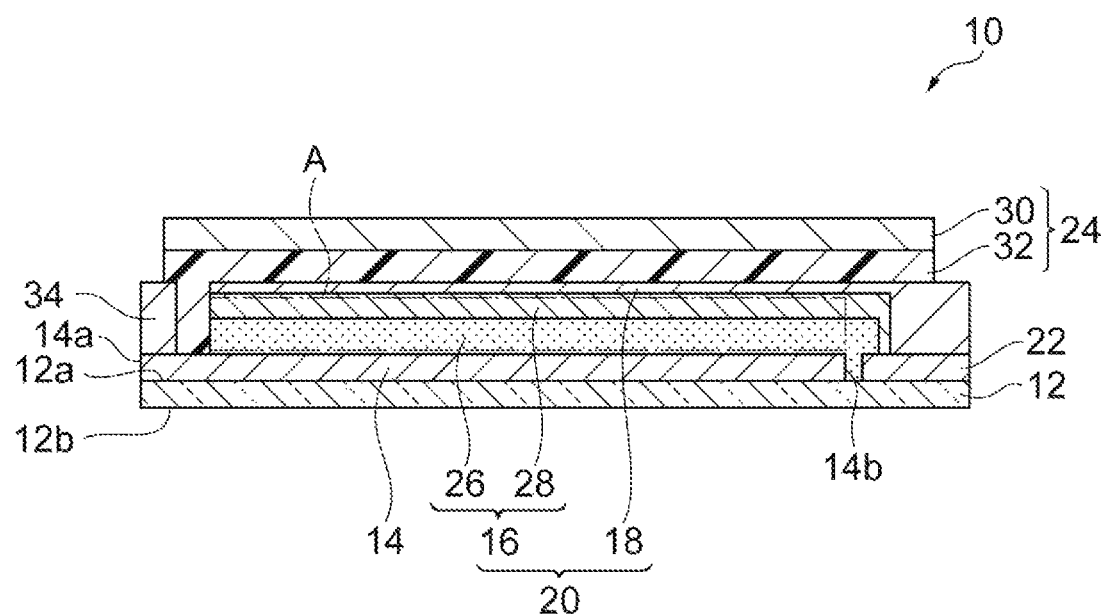
FIG. 1 is a schematic view illustrating a cross-sectional configuration of an organic EL device manufactured by a method for manufacturing an organic device according to an embodiment.

Hereinafter, embodiments of the present invention will be described with reference to the drawings. The same elements will be denoted by the same reference numerals, and an overlapping description will be omitted. Dimension proportions in the drawings do not necessarily coincide with those in a description. Examples of an organic device include an organic EL device, an organic solar cell, an organic photodetector, and an organic transistor. In embodiments described below, unless otherwise stated, an organic device is an organic EL device.

As illustrated in FIG. 1, an organic EL device 10 manufactured by a method for manufacturing an organic device according to the present embodiment includes a flexible substrate 12, an anode layer (first electrode layer) 14, and a laminated structure 20 including a device functional portion 16 and a cathode layer (second electrode layer) 18. The organic EL device 10 is, for example, an organic EL lighting panel used for lighting.

The organic EL device 10 may include an extraction electrode 22 electrically connected to the cathode layer 18.

The organic EL device 10 may include a sealing member 24 sealing the device functional portion 16. The organic EL device 10 can take a form of bottom emission or top emission.

Hereinafter, unless otherwise stated, a bottom emission type organic EL device 10 including the extraction electrode 22 and the sealing member 24 will be described.

[Flexible Substrate]

The flexible substrate 12 is translucent to visible light (light having a wavelength of 400 nm to 800 nm). The flexible substrate 12 has a thickness of, for example, 30 µm or more to 500 µm or less, and can have a film shape. In a case where the flexible substrate 12 is made of a resin, the thickness of the flexible substrate 12 is preferably 45 µm or more in terms of prevention of substrate twist, wrinkles, and elongation at the time of continuously conveying the flexible substrate in a roll-to-roll manner, and is preferably 125 µm or less in terms of flexibility.

The flexible substrate 12 is, for example, a plastic film. Examples of a material of the flexible substrate 12 include polyether sulfone (PES); a polyester resin such as polyethylene terephthalate (PET), polyethylene naphthalate (PEN) or the like; a polyolefin resin such as polyethylene (PE), polypropylene (PP), cyclic polyolefin or the like; a polyamide resin; a polycarbonate resin; a polystyrene resin; a polyvinyl alcohol resin; a saponified ethylene-vinyl acetate copolymer, a polyacrylonitrile resin; an acetal resin; a polyimide resin; an epoxy resin; and the like.

Among the resins described above, the polyester resin or the polyolefin resin is preferable and the polyethylene terephthalate or the polyethylene naphthalate is more preferable as the material of the flexible substrate 12, because heat resistance is high, a linear expansion coefficient is low, and a manufacturing cost is low. One of these resins may be used alone, or two or more of these resins may be used in combination.

The flexible substrate 12 may be thin film glass. In a case where the flexible substrate 12 is the thin film glass, a thickness of the flexible substrate 12 is preferably 30 µm or more in terms of strength, and is preferably 100 µm or less in terms of flexibility.

A barrier layer having at least one of a gas barrier function and a moisture barrier function may be arranged on a first main surface 12a of the flexible substrate 12. In the bottom emission type organic EL device 10, a second main surface 12b of the flexible substrate 12 functions as a light emitting surface.

[Anode Layer]

The anode layer 14 is provided on the first main surface 12a of the flexible substrate 12. A translucent electrode layer is used for the anode layer 14. As the translucent electrode layer, a thin film containing metal oxide, metal sulfide, a metal or the like having a high electrical conductivity can be used, and a thin film having a high light transmittance is suitably used. For example, a thin film made of indium oxide, zinc oxide, tin oxide, indium tin oxide (ITO), indium zinc oxide (IZO), gold, platinum, silver, copper, or the like is used for the anode layer 14, and among them, a thin film made of ITO, IZO or tin oxide is suitably used for the anode layer 14.

As the anode layer 14, a transparent conductive film of an organic substance such as polyaniline and a derivative thereof, polythiophene and a derivative thereof, or the like, may be used. As the anode layer 14, an electrode obtained by patterning the metals, the metal alloys or the like described above in a mesh shape, or an electrode in which a nanowire containing silver is formed in a network shape may be used.

A thickness of the anode layer 14 can be determined in consideration of light transmittance, electrical conductivity and the like. The thickness of the anode layer 14 is usually 10 nm to 10 µm, preferably 20 nm to 1 µm, and more preferably 50 nm to 200 nm.

[Extraction Electrode]

The extraction electrode 22 is arranged on the first main surface 12a of the flexible substrate 12 so as to be spaced apart from the anode layer 14. A thickness and a material of the extraction electrode 22 can be similar to those of the anode layer 14.

[Laminated Structure]

The laminated structure 20 is provided on the anode layer 14, and has the device functional portion 16 and the cathode layer 18 laminated on the device functional portion 16.

(Device Functional Portion)

The device functional portion 16 is a functional portion contributing to light emission of the organic EL device 10 such as charge transfer, charge recombination and the like according to power (for example, a voltage) applied to the anode layer 14 and the cathode layer 18. The device functional portion 16 is arranged on a main surface (an opposite side of a surface in contact with the flexible substrate 12) of the anode layer 14. The device functional portion 16 is arranged such that an area on one end portion 14a of the anode layer 14 (an end portion of the anode layer 14 on an opposite side to a side on which the extraction electrode 22 is arranged) is exposed from the device functional portion 16. The device functional portion 16 may be arranged so as to cover the other end portion 14b of the anode layer 14 (an end portion of the anode layer 14 on a side where the extraction electrode 22 is arranged). In this case, the device functional portion 16 is also arranged on the first main surface 12a of the flexible substrate 12. The device functional portion 16 includes at least one functional layer, and includes a light emitting layer 26 and an electron injection layer (first layer) 28 in the present embodiment.

The light emitting layer 26 is a functional layer having a function of emitting light having a predetermined wavelength, and is an organic layer. An optimum value of a thickness of the light emitting layer 26 varies depending on a used material. The thickness of the light emitting layer 26 is appropriately set so that a drive voltage and a light emission efficiency become appropriate values. The thickness of the light emitting layer 26 is, for example, 1 nm to 1 µm, preferably 2 nm to 500 nm, and more preferably 10 nm to 200 nm.

The light emitting layer 26 usually contains a light emitting material mainly emitting at least one of fluorescence and phosphorescence, or the light emitting material and a dopant material for a light emitting layer for assisting the light emitting material. An organic substance of the light emitting material emitting at least one of the fluorescence and the phosphorescence may be a low molecular weight compound or may be a high molecular weight compound. Examples of the light emitting material include the following pigment materials, metal complex materials, polymer materials, and the like.

(Pigment Material)

Examples of the pigment material can include cyclopentamine and a derivative thereof, tetraphenylbutadiene and a derivative thereof, triphenylamine and a derivative thereof, oxadiazole and a derivative thereof, pyrazoloquinoline and a derivative thereof, distyrylbenzene and a derivative thereof, distyrylarylene and a derivative thereof, pyrrole and a derivative thereof, a thiophene compound, a pyridine compound, perinone and a derivative thereof, perylene and a derivative thereof, oligothiophene and a derivative thereof, an oxadiazole dimer, a pyrazoline dimer, quinacridone and a derivative thereof, coumarin and a derivative thereof, and the like.

(Metal Complex Material)

Examples of the metal complex material can include metal complexes having rare earth metals such as Tb, Eu, Dy, or the like, or Al, Zn, Be, Pt, Ir, or the like, as central metals and having oxadiazole, thiadiazole, phenylpyridine, phenylbenzimidazole, a quinoline structure, or the like, as ligands. Examples of the metal complexes can include metal complexes having light emission from a triplet excited state such as an iridium complex, a platinum complex or the like, an aluminum quinolinol complex, a benzoquinolinol beryllium complex, a benzoxazolyl zinc complex, a benzothiazole zinc complex, an azomethyl zinc complex, a porphyrin zinc complex, a phenanthroline europium complex, and the like.

(Polymer Material)

Examples of the polymer materials can include polyparaphenylene vinylene and a derivative thereof, polythiophene and a derivative thereof, polyparaphenylene and a derivative thereof, polysilane and a derivative thereof, polyacetylene and a derivative thereof, polyfluorene and a derivative thereof, polyvinylcarbazole and a derivative thereof, a material obtained by polymerizing the pigment material or the metal complex material, and the like.

The dopant material for a light emitting layer is added, for example, in order to improve light emission efficiency or to change a light emission wavelength. Examples of the dopant material for a light emitting layer can include perylene and a derivative thereof, coumarin and a derivative thereof, rubrene and a derivative thereof, quinacridone and a derivative thereof, squarylium and a derivative thereof, porphyrin and a derivative thereof, a styryl pigment, tetracene and a derivative thereof, pyrazolone and a derivative thereof, decacyclene and a derivative thereof, phenoxazone and a derivative thereof, and the like.

[Electron Injection Layer]

The electron injection layer 28 is a layer having a function of improving electron injection efficiency from the cathode layer 18 to the light emitting layer 26. A known electron injection material can be used as a material of the electron injection layer 28. Examples of the material of the electron injection layer 28 include an alkali metal, an alkaline earth metal, an alloy containing one or more of the alkali metal and the alkaline earth metal, an oxide of the alkali metal or the alkaline earth metal, a halide of the alkali metal or the alkaline earth metal, a carbonate of the alkali metal or the alkaline earth metal, a mixture of these materials, or the like. An example of the electron injection material is sodium fluoride (NaF). In addition, a layer in which a conventionally known electron transporting organic material and an organic metal complex containing an alkali metal are mixed with each other can be used as the electron injection layer 28.

In a case where the material of the electron injection layer 28 is an oxide and a fluoride, a thickness of the electron injection layer 28 is preferably 0.5 nm to 20 nm. In a case where an insulation property of the material of the electron injection layer 28 is strong, it is preferable the electron injection layer 28 is a thin film, in terms of suppression of an increase in a drive voltage of the organic EL device 10. In this case, it is preferable that the thickness of the electron injection layer 28 is, for example, 0.5 nm to 10 nm. In terms of an electron injection property, it is preferable that the thickness of the electron injection layer 28 is 2 nm to 7 nm. The electron injection layer 28 may be formed, for example, between the extraction electrode 22 and the cathode layer 18.

(Cathode Layer)

The cathode layer 18 is arranged on a main surface (an opposite side of a surface in contact with the anode layer 14 or the flexible substrate 12) of the device functional portion 16. The cathode layer 18 is also arranged on the extraction electrode 22. Therefore, the cathode layer 18 and the extraction electrode 22 are connected to each other. The cathode layer 18 may be formed of a laminate in which two or more layers are laminated.

Examples of a material of the cathode layer 18 can include an alkali metal, an alkaline earth metal, a transition metal, a group 13 metal of the periodic table, and the like. Specific examples of the material of the cathode layer 18 include metals such as lithium, sodium, potassium, rubidium, cesium, beryllium, magnesium, calcium, strontium, barium, aluminum, scandium, vanadium, zinc, yttrium, indium, cerium, samarium, europium, terbium, ytterbium, and the like, alloys of two or more of the metals, alloys of one or more of the metals and one or more of gold, silver, platinum, copper, manganese, titanium, cobalt, nickel, tungsten and tin, graphite, a graphite intercalation compound, and the like. Examples of the alloys can include a magnesium-silver alloy, a magnesium-indium alloy, a magnesium-aluminum alloy, an indium-silver alloy, a lithium-aluminum alloy, a lithium-magnesium alloy, a lithium-indium alloy, a calcium-aluminum alloy, and the like.

As the cathode layer 18, for example, a transparent conductive electrode made of a conductive metal oxide, a conductive organic substance or the like can be used. Specific examples of the conductive metal oxide can include indium oxide, zinc oxide, tin oxide, ITO, IZO, and the like. Examples of the conductive organic substance can include polyaniline and a derivative thereof, polythiophene and a derivative thereof, and the like.

In a form in which a part of the cathode layer 18 is exposed from the sealing member 24 as illustrated in FIG. 1, the material of the cathode layer 18 is preferably a material (for example, transition metal oxide, aluminum, silver, or the like) which is less susceptible to moisture.

A thickness of the cathode layer 18 is set in consideration of electrical conductivity and durability. The thickness of the cathode layer 18 is usually 10 nm to 10 μm, preferably 20 nm to 1 μm, and more preferably 50 nm to 500 nm.

[Sealing Member]

The sealing member 24 is arranged at the uppermost portion of the organic EL device 10. The sealing member 24 has a sealing base material 30 and an adhesive portion 32.

The sealing base material 30 has a moisture barrier function. The sealing base material 30 may have a gas barrier function. Examples of the sealing base material 30 include a metal foil, a barrier film in which a barrier functional layer is formed on a front surface or a back surface or both surfaces of a transparent plastic film, a thin film glass having flexibility, a film in which a metal having a barrier property is laminated on a plastic film, and the like. Examples of the barrier functional layer include the moisture barrier layer described above, and the like. A thickness of the sealing base material 30 is, for example, 10 μm to 300 μm. As the metal foil, a copper foil, an aluminum foil, and a stainless steel foil are preferable in terms of a barrier property. In a case where the sealing base material 30 is the metal foil, a thickness of the metal foil is preferably as large as possible in terms of suppression of pinholes, but is preferably 10 μm to 50 μm in terms of flexibility.

The adhesive portion 32 is used in order to stick the sealing base material 30 to the flexible substrate 12, the anode layer 14, the device functional portion 16, and the cathode layer 18. The adhesive portion 32 is arranged so as to cover at least the device functional portion 16.

Specifically, the adhesive portion 32 is made of a photocurable or thermosetting acrylate resin, a photocurable or thermosetting epoxy resin, or a photocurable or thermosetting polyimide resin. Besides the above, a resin film that can be fusion-bonded by a commonly used impulse sealer, for example, a thermal bonding film such as an ethylene vinyl acetate copolymer (EVA), a polypropylene (PP) film, a polyethylene (PE) film, a polybutadiene (PB) film, and the like, can be used. Thermoplastic resins such as vinyl acetate-based, polyvinyl alcohol-based, acryl-based, polyethylene-based, epoxy-based, cellulose-based, a saturated hydrocarbon resin containing a cyclohexane ring, a styrene-isobutylene modified resin, and the like, can also be used. A pressure sensitive adhesive (PSA) that can be easily attached due to adhesion can also be used.

Hygroscopic fine particles (smaller than a thickness of the adhesive) can be contained in adhesive used for the adhesive portion 32. Examples of the hygroscopic fine particles include a metal oxide that generates a chemical reaction with moisture at normal temperature, and zeolite that physically adsorbs moisture.

A thickness of the adhesive portion 32 is preferably 1 μm to 100 μm, more preferably 5 μm to 60 μm, and still more preferably 10 μm to 30 μm. A water content of the adhesive portion 32 is preferably 300 ppm or less (on a weight basis).

An area in which the anode layer 14 and the cathode layer 18 overlap each other (an area surrounded by an alternate long and short dash line in FIG. 1) in the device functional portion 16 included in the organic EL device 10 is a function generating area A. In the organic EL device 10, the function generating area A is a light emitting area.

In one embodiment, the organic EL device 10 may have a conductive wall portion 34 provided on the anode layer 14 as illustrated in FIG. 1. The wall portion 34 is arranged to be spaced apart from the cathode layer 18, and, for example, the adhesive portion 32 is filled between the wall portion 34 and the cathode layer 18. However, an insulating member different from the adhesive portion 32 may be filled between the wall portion 34 and the cathode layer 18. The wall portion 34 can be made of the same material as that of the cathode layer 18, and have the same thickness as that of the cathode layer 18.

In the present embodiment, the electron injection layer 28 is described as a part of the device functional portion 16, but the electron injection layer 28 may be a part of the cathode layer 18.

[Method for Manufacturing Organic EL Device]

Figure 2:
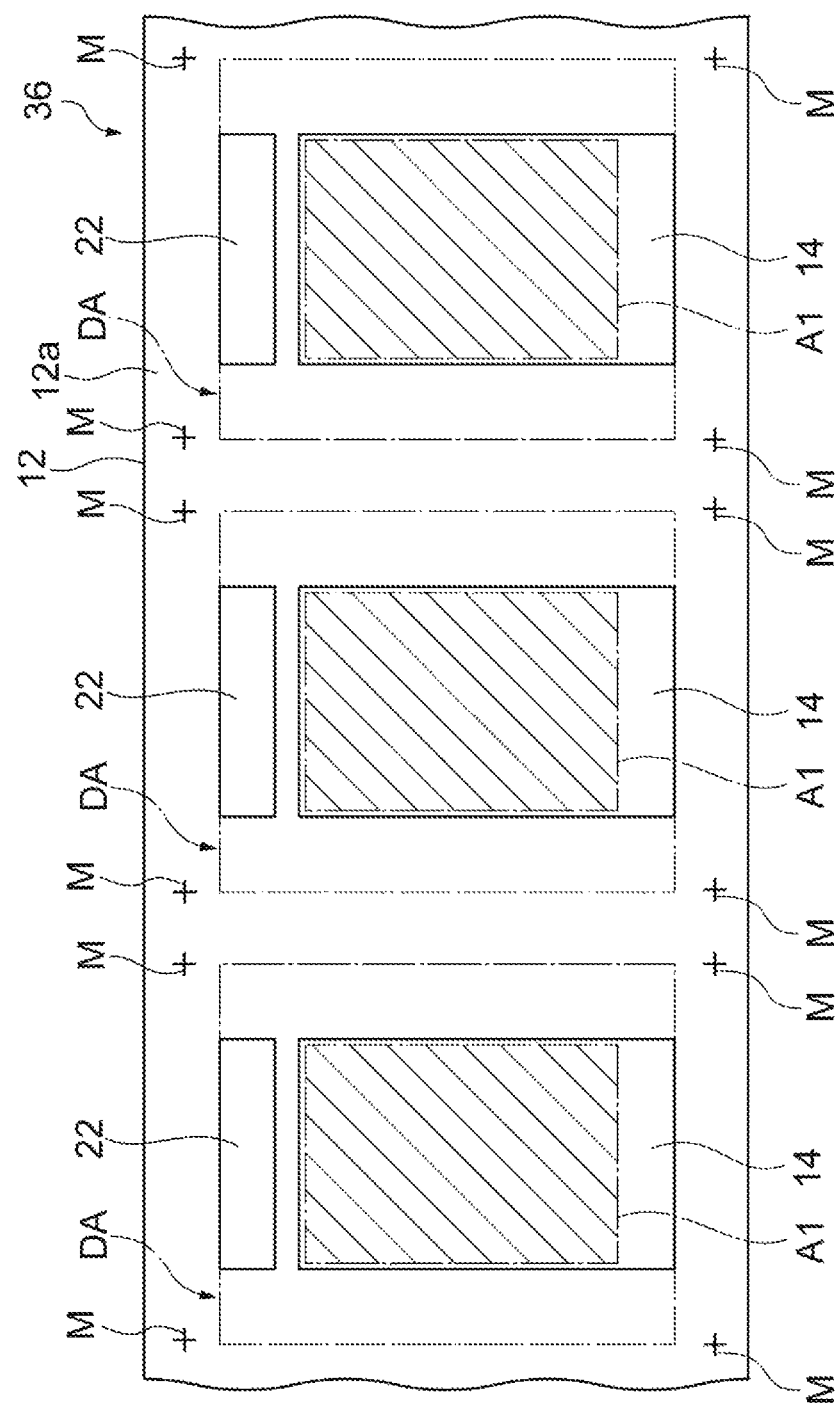
FIG. 2 is a plan view of a substrate with an electrode used for manufacturing the organic EL device.

A method for manufacturing the organic EL device 10 having the configuration described above will be described. Hereinafter, a form in which the organic EL device 10 is manufactured using a substrate 36 with an electrode in which the anode layer 14 and the extraction electrode 22 are formed on a long flexible substrate 12, as illustrated in FIG. 2, will be described.

In the present specification, the long flexible substrate 12 and the long substrate 36 with an electrode extend in-one direction, and they are longer in the extending direction than in a direction (width direction) perpendicular to the extending direction.

In the substrate 36 with an electrode, a plurality of device forming areas DA are virtually set on the first main surface 12a of the flexible substrate 12. A set of anode layer 14 and extraction electrode 22 is provided in each device forming area DA. Therefore, the number of anode layers 14 and the number of extraction electrodes 22 are the same as each other, and one extraction electrode 22 is arranged to be spaced apart from one anode layer 14 by a predetermined interval in a direction (width direction) orthogonal to a longitudinal direction of the flexible substrate 12.

The anode layer 14 and the extraction electrode 22 may be formed by a known method in the manufacture of the organic EL device 10. Examples of the method for forming the anode layer 14 and the extraction electrode 22 include a vacuum deposition method, an ion plating method, a plating method, a coating method, and the like. Examples of the coating method include an inkjet printing method, but another known coating method may be used as long as it can form the anode layer 14 and the extraction electrode 22. Examples of the known coating method other than the inkjet printing method include a microgravure coating method, a gravure coating method, a bar coating method, a roll coating method, a wire bar coating method, a spray coating method, a screen printing method, a flexographic printing method, an offset printing method, a nozzle printing method, and the like.

The anode layer 14 and the extraction electrode 22 can be formed, for example, by forming a conductive layer on the first main surface 12a of the flexible substrate 12 and then patterning the conductive layer in a pattern of each of the anode layer 14 and the extraction electrode 22. The anode layer 14 and the extraction electrode 22 may be formed by directly manufacturing a conductive layer corresponding to the pattern of each of the anode layer 14 and the extraction electrode 22.

In the anode layer 14 of the substrate 36 with an electrode illustrated in FIG. 2, an area surrounded by an alternate long and short dash line and hatched is a function generating design area A1 in which the function generating area A should be formed on the flexible substrate 12. In other words, the device functional portion 16 has the function generating area A by forming the device functional portion 16 and the cathode layer 18 on the function generating design area A1. In FIG. 2, in order to describe the function generating design area A1, the function generating design area A1 is hatched for convenience.

Alignment marks M may be formed on the substrate 36 with an electrode as reference positions of alignment in a manufacturing step. The alignment marks M are formed, for example, outside the device forming area DA. In FIG. 2, a form in which the alignment marks are formed in the both end portions of the flexible substrate 12 in a width direction is exemplified. A shape of the alignment mark M is not limited to a cross shape as illustrated in FIG. 2, and may be another shape such as a linear shape or the like. The alignment mark M may be formed of a material that allows the alignment mark M to be photographed, for example, by a camera or the like. The alignment mark M may be formed of the same material as that of the anode layer 14. The alignment mark M may be formed together with the anode layer 14 at the time of forming the anode layer 14 or may be formed in advance before forming the anode layer 14.

In a case of manufacturing the organic EL device 10 using the substrate 36 with an electrode, the method for manufacturing the organic EL device 10 includes a step (hereinafter, referred to as a "laminated structure forming step") S10 of forming the laminated structure 20 including the device functional portion 16 and the cathode layer 18 on the substrate 36 with an electrode and a step (hereinafter, referred to as a "sticking step") S20 of sticking the sealing member 24 to the substrate 36 with an electrode on which the laminated structure 20 is formed.

As described above, the step of manufacturing the organic EL device 10 using substrate 36 with an electrode is described, but the method for manufacturing the organic EL device 10 may include a step of producing the substrate 36 with an electrode (that is, a step of forming the anode layer 14 on the flexible substrate 12) before the laminated structure forming step S10. As described in the present embodiment, in a form in which the organic EL device 10 includes the extraction electrode 22, the extraction electrode 22 may be formed in a step of forming the anode layer 14.

Figure 3:
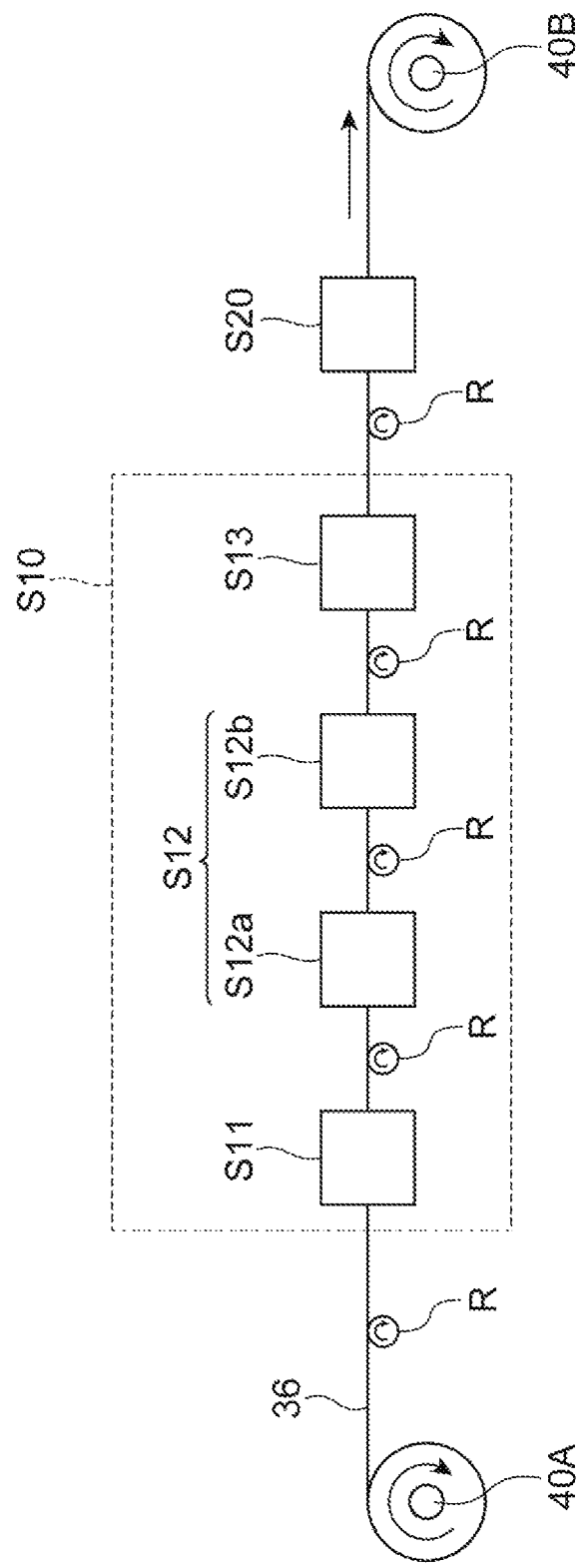
FIG. 3 is a view schematically illustrating a method for manufacturing an organic EL device in a roll-to-roll manner.

In the present embodiment, as conceptually illustrated in FIG. 3, the laminated structure forming step S10 and the sticking step S20 are performed by adopting a roll-to-roll manner. Specifically, a roll-like substrate 36 with an electrode is set in an unwinding part 40A. The substrate 36 with an electrode is unwound from the roll-like substrate 36 with an electrode set in the unwinding part 40A. The laminated structure forming step S10 and the sticking step S20 are performed while the unwound substrate 36 with an electrode is conveyed toward a winding part 40B by guide rolls R. The substrate 36 with an electrode on which the sticking step S20 is performed is wound in a roll shape by the winding part 40B. The unwinding part 40A, the winding part 40B, and the guide rolls R constitute a part of a conveyance mechanism of the substrate 36 with an electrode. The conveyance mechanism can include other known components such as a tension adjusting mechanism or the like. The laminated structure forming step S10 and the sticking step S20 will be described.

(Laminated Structure Forming Step)

The laminated structure forming step S10 includes a light emitting layer forming step S11, a film forming step S12 including an electron injection layer forming step S12a and a conductive layer forming step S12b, and a patterning step S13, as illustrated in FIG. 3.

Figure 4:
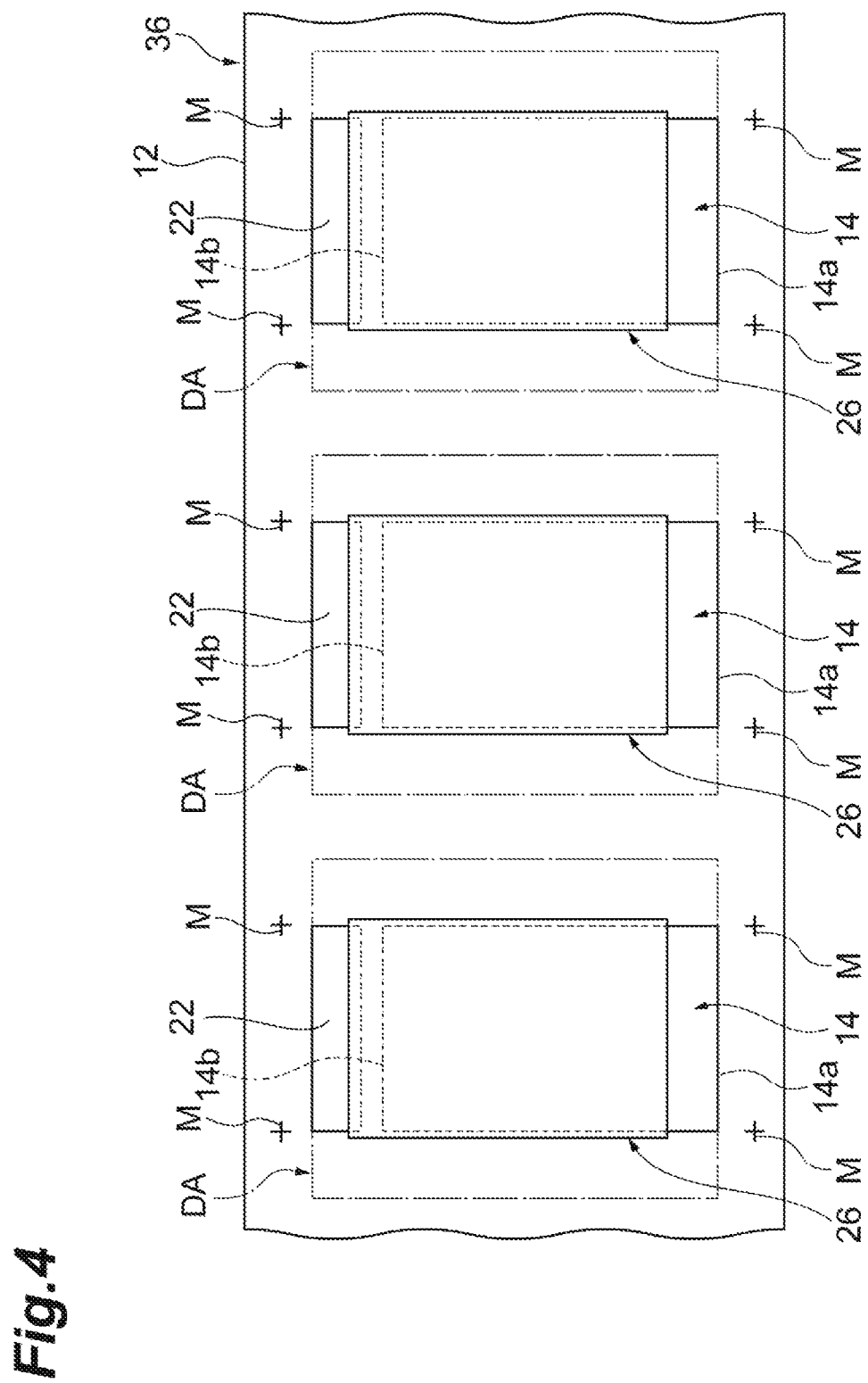
FIG. 4 is a view for describing a method for manufacturing the organic EL device illustrated in FIG. 1, and is a plan view of a substrate with an electrode on which a light emitting layer is formed.

In the light emitting layer forming step S11, the light emitting layer 26 included in the device functional portion 16 is formed on the anode layer 14 of each of the plurality of device forming areas DA. In this step, in the organic EL device 10 that is to be manufactured, the light emitting layer 26 is formed so as to expose the area on the end portion 14a side of the anode layer 14 but cover the other area including the function generating design area A1. The light emitting layer 26 can be formed, for example, by a coating method while the substrate 36 with an electrode is continuously conveyed in a longitudinal direction of the substrate 36 with an electrode. Therefore, as illustrated in FIG. 4, the light emitting layer 26 is formed for each of the plurality of device forming areas DA. Examples of the coating method can be similar to the examples given in the description of the anode layer 14. The light emitting layer 26 may be formed by a dry film forming method. In the present specification, the dry film forming method is a physical vapor deposition method. Examples of the dry film forming method include a vacuum deposition method, a sputtering method and the like. In the light emitting layer forming step S11, a stripe-like light emitting layer 26 may be formed across the plurality of device forming areas DA. In that case, portions other than the function generating design area A1 may be removed.

As illustrated in FIG. 3, in the film forming step S12, the electron injection layer forming step S12a and the conductive layer forming step S12b are sequentially performed while the substrate 36 with an electrode is continuously conveyed in the longitudinal direction of the substrate 36 with an electrode.

Figure 5:
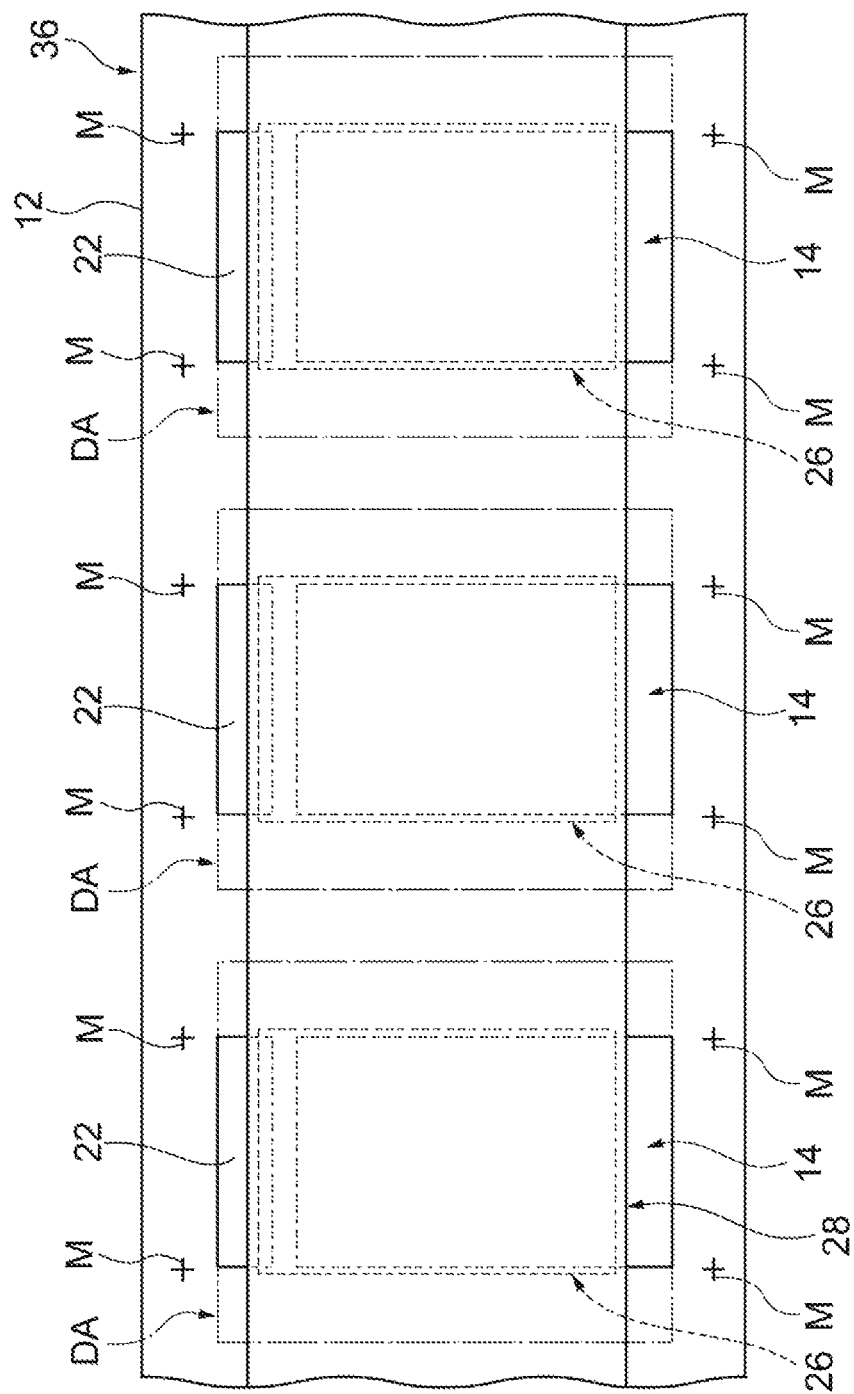
FIG. 5 is a view for describing a method for manufacturing the organic EL device illustrated in FIG. 1, and is a plan view of a substrate with an electrode on which an electron injection layer is formed.

In the electron injection layer forming step S12a, as illustrated in FIG. 5, the electron injection layer (first layer) 28 is formed in a stripe shape across the plurality of device forming areas DA. In the electron injection layer forming step S12a, the electron injection layer 28 is formed so as to cover the light emitting layer 26. In FIG. 5, the anode layer 14 and the extraction electrode 22, and the light emitting layer 26, which is a layer formed in the previous step, are indicated by broken lines.

Figure 6:
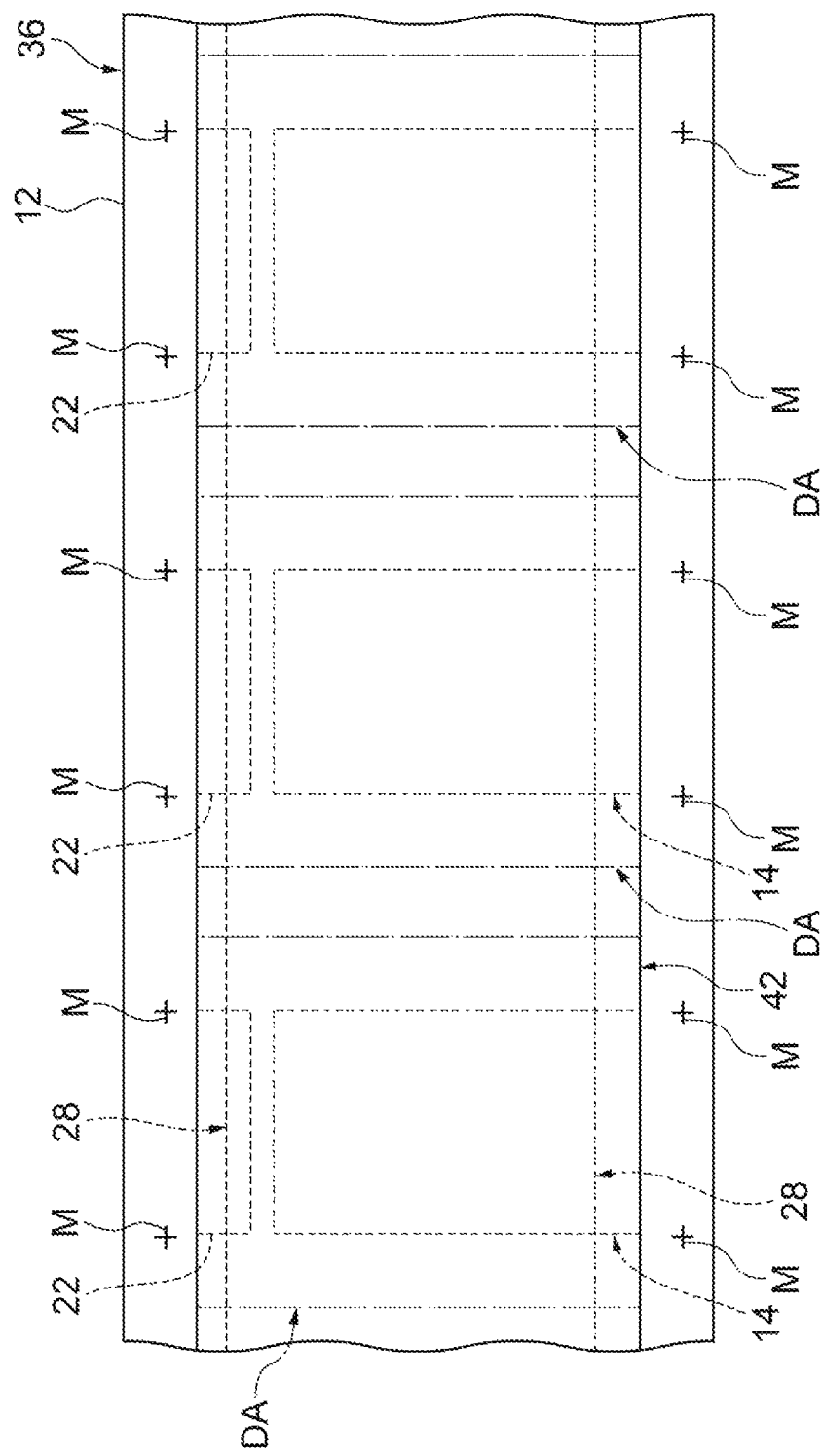
FIG. 6 is a view for describing a method for manufacturing the organic EL device illustrated in FIG. 1, and is a plan view of a substrate with an electrode on which a conductive layer that is to be a cathode layer is formed.

In the conductive layer forming step S12b, as illustrated in FIG. 6, a conductive layer (second layer) 42 is formed in a stripe shape across the plurality of device forming areas DA. In the conductive layer forming step S12b, the conductive layer 42 is formed so as to cover the electron injection layer 28. In FIG. 6, the anode layer 14 and the extraction electrode 22, and the electron injection layer 28, which is a layer formed in the previous step, are indicated by broken lines. In FIG. 6, the conductive layer 42 is formed over the entire device forming area DA in the width direction of the flexible substrate 12. However, the conductive layer 42 may be formed so as to cover the electron injection layer 28 and to be arranged on the extraction electrode 22.

Figure 7:
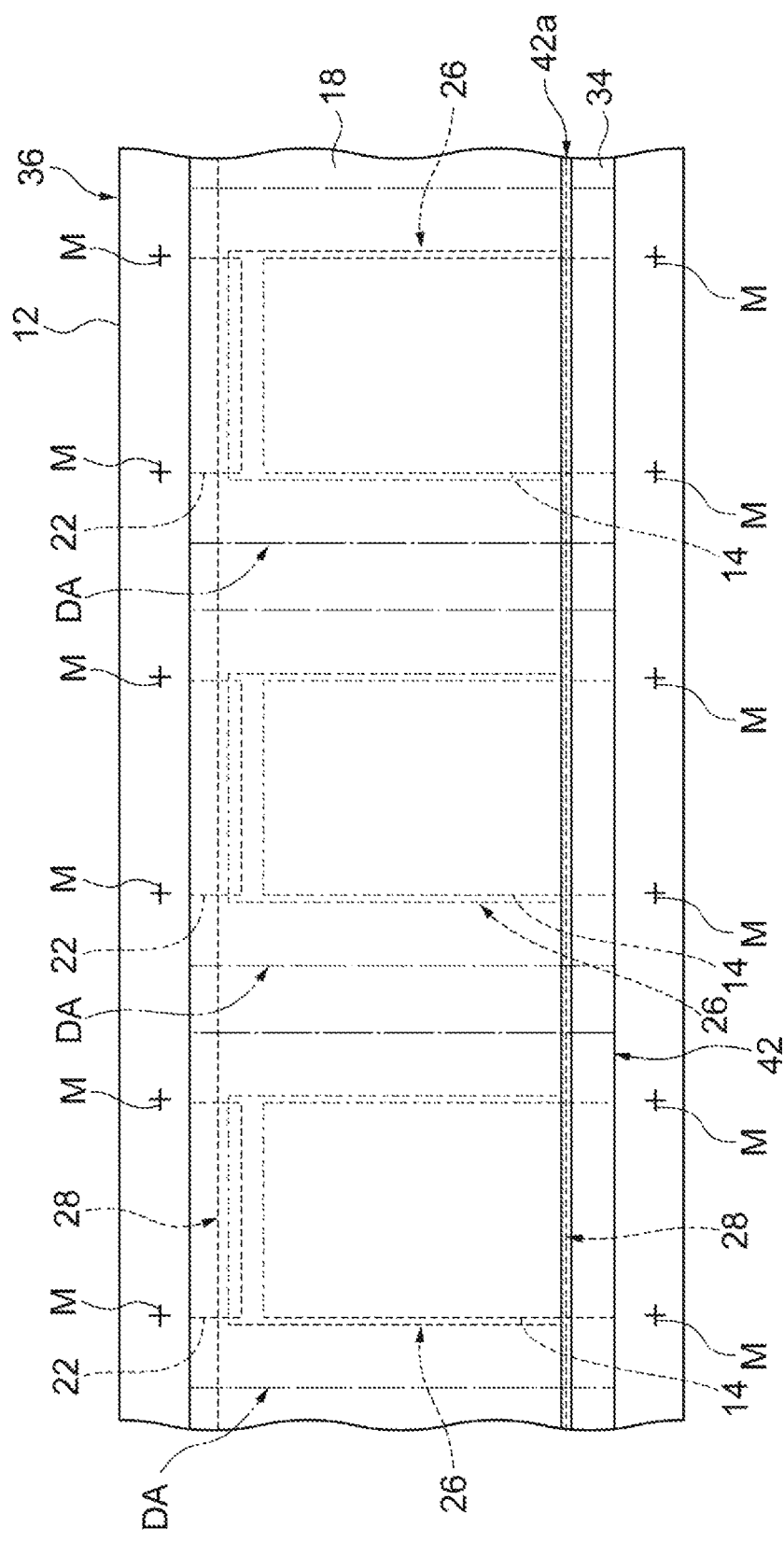
FIG. 7 is a view for describing a step of obtaining the cathode layer from the conductive layer.

Subsequently, the patterning step S13 is performed. In the patterning step S13, as illustrated in FIG. 7, the cathode layer 18 is obtained by patterning the conductive layer 42. In a form illustrated in FIG. 7, the conductive layer 42 is separated into the cathode layer 18 and the wall portion 34 by forming a hole portion 42a penetrating through the conductive layer 42 and extending in the longitudinal direction in the conductive layer 42. Therefore, the hole portion 42a is a gap between the cathode layer 18 and the wall portion 34 in FIG. 1. In a form in which the conductive layer 42 is patterned by forming such a hole portion 42a, the cathode layer 18 and the wall portion 34 also have a stripe shape when the patterning step S13 ends. In FIG. 7, the anode layer 14 and the extraction electrode 22, and the light emitting layer 26 and the electron injection layer 28 are indicated by broken lines. In the form illustrated in FIG. 7, the hole portion 42a is formed so that a side surface of the hole portion 42a is flush with a side surface of the light emitting layer 26 in order to ensure insulation between the cathode layer 18 and the electron injection layer 28, and the anode layer 14.

A method for forming the hole portion 42a is not limited. Examples of the method for forming the hole portion 42a include a method using a laser processing technology and a method for removing a portion of a hole portion forming area in the conductive layer 42 by attaching a tape to the hole portion forming area and peeling off the tape. The hole portion 42a only has to be formed so as to insulate and separate the cathode layer 18 and the anode layer 14 from each other. The patterning in the patterning step S13 is not limited to the form illustrated in FIG. 7, and may be performed according to a shape of the cathode layer 18 required for the organic EL device 10.

As described above, the cathode layer 18 is obtained by removing a part of the conductive layer 42. Therefore, the conductive layer forming step S12b and the patterning step S13 constitute a step of forming the cathode layer 18.

(Sticking Step)

Figure 8:
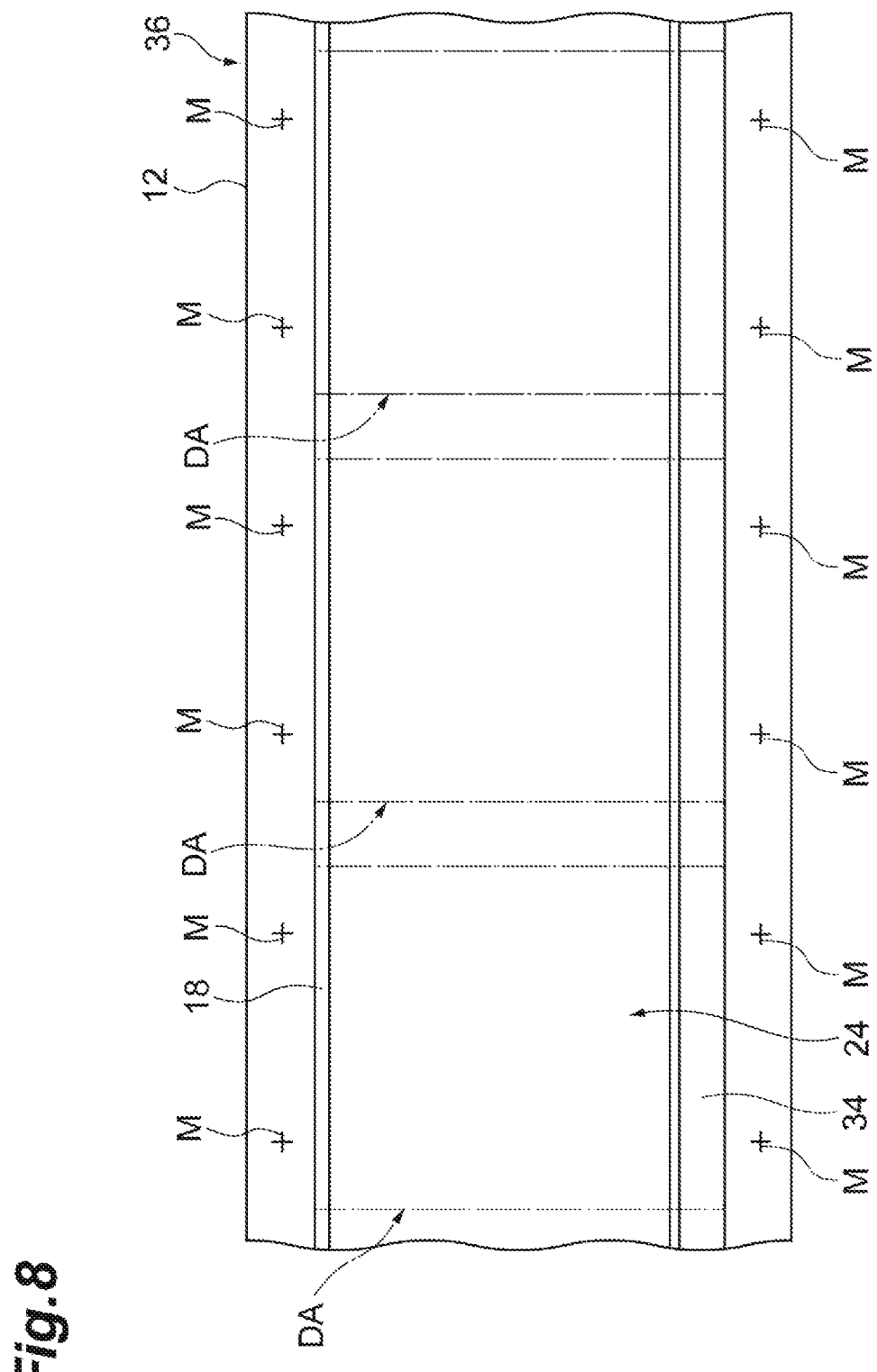
FIG. 8 is a plan view of a substrate with an electrode to which a sealing member is stuck.

In the sticking step S20, a long sealing member 24 is continuously stuck to the substrate 36 with an electrode, as illustrated in FIG. 8, while the substrate 36 with an electrode subjected to the laminated structure forming step S10 is conveyed in the longitudinal direction. Specifically, by heating and pressing the substrate 36 with an electrode and the sealing member 24 while overlapping the substrate 36 with an electrode and the sealing member 24 with each other so that the first main surface 12a of the flexible substrate 12 and the adhesive portion 32 face each other, the substrate 36 with an electrode and the sealing member 24 are stuck to each other. For example, the sealing member 24 and the substrate 36 with an electrode on which the laminated structure 20 is formed may be sent between two heating rollers making a pair, and may be heated and pressed by the two heating rollers.

The organic EL device 10 illustrated in FIG. 1 is formed in each of the device forming areas DA on the substrate 36 with an electrode subjected to the sticking step S20. Therefore, the method for manufacturing the organic EL device 10 may include the singulation step of singulating each device forming area DA from the substrate 36 with an electrode subjected to the sticking step S20 to obtaining the organic EL device 10 having a product size. This singulation step may be implemented by cutting the device forming area DA while continuously conveying the substrate 36 with an electrode after the sticking step S20.

Figure 9:
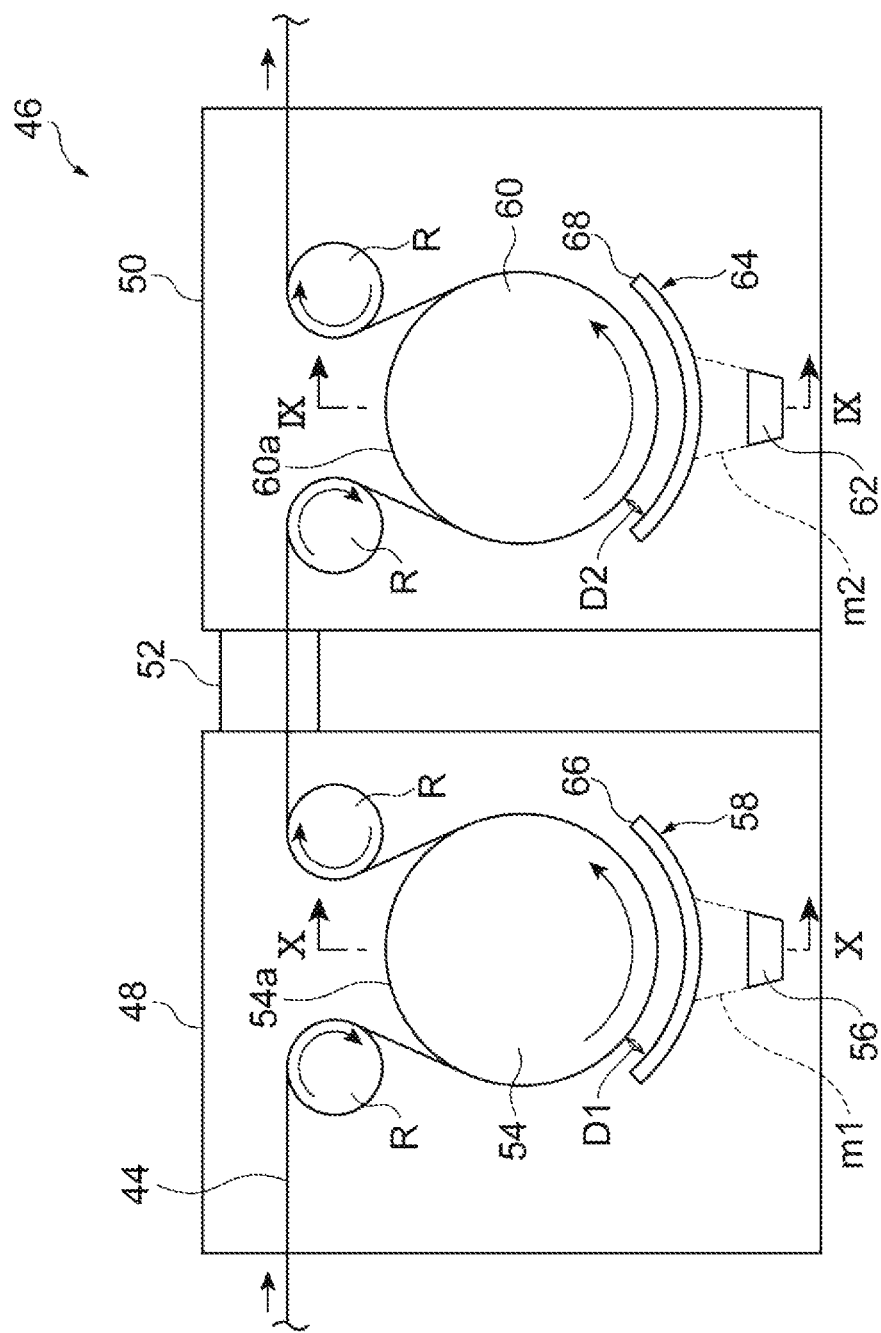
FIG. 9 is a schematic view of a film forming device used in a film forming step.

Next, the film forming step S12 will be described in detail with reference to FIGS. 9, 10, and 11. FIG. 9 is a schematic view for describing the film forming step S12. In the film forming step S12, the substrate 36 with an electrode is continuously conveyed in the longitudinal direction while being guided by the guide rolls R. A film forming device 46 is provided on a conveyance path of the substrate 36 with an electrode. In the film forming device 46, the electron injection layer 28 and the conductive layer 42 are sequentially formed on the substrate 36 with an electrode using a dry film forming method. Examples of the dry film forming method include a vacuum deposition method, a sputtering method, an ion plating method, and the like.

Hereinafter, for convenience of explanation, a member on which each of the electron injection layer 28 and the conductive layer 42 is to be formed is referred to as a base material 44 to receive film. The base material 44 to receive film on which the electron injection layer 28 is to be formed is the substrate 36 with an electrode on Which the light emitting layer 26 is formed. The base material 44 to receive film on which the conductive layer 42 is to be formed is the substrate 36 with an electrode on Which the electron injection layer 28 is thrilled. In FIG. 9, the base material 44 to receive film is schematically illustrated using a solid line. In FIGS. 10 and 11, the base material 44 to receive film is partially enlarged and illustrated for convenience of illustration, and thicknesses and the like of layers do not coincide with those described.

As illustrated in FIG. 9, the film forming device 46 includes a first film forming chamber 48 and a second film forming chamber 50. The first film forming chamber 48 and the second film forming chamber 50 are connected to each other by a connecting part 52. The first film forming chamber 48 and the second film forming chamber 50 may be directly connected to each other. The first film forming chamber 48 is a film forming chamber for forming the electron injection layer 28. The second film forming chamber 50 is a film forming chamber for forming the conductive layer 42. The first film forming chamber 48 and the second film forming chamber 50 are configured so that inner portions thereof are set in a vacuum or reduced pressure state. The first film forming chamber 48 and the second film forming chamber 50 may be configured so that inner portions thereof are set to an inert gas atmosphere environment.

An inner portion of the connecting part 52 may be set to an environment close to an environment in the first film forming chamber 48 and the second film forming chamber 50.

A first film forming roll 54, a first film forming source 56, a first shielding part 58, and a plurality of guide rolls R are arranged in the first film forming chamber 48. Similarly, a second film forming roll 60, a second film forming source 62, a second shielding part 64, and a plurality of guide rolls R are arranged in the second film forming chamber 50.

The first film forming roll 54 is a roll on which the base material 44 to receive film is wound around a roll surface 54a. The first film forming roll 54 is rotatably supported. The phrase "the base material 44 to receive film is wound around the first film forming roll 54" means a state where the flexible substrate 12 included in the base material 44 to receive film is in contact with a part of the roll surface 54a so that a longitudinal direction of the base material 44 to receive film and a rotation direction of the first film forming roll 54 are directed to the same direction and the base material 44 to receive film covers the first film forming roll 54 (the same applies to a case of the second film forming roll 55 as described below). An example of the first film forming roll 54 is a cylindrical roll. The first film forming roll 54 is, for example, a can roll. As illustrated in FIGS. 9 and 10, the first film forming roll 54 and the plurality of guide rolls R are arranged so that the base material 44 to receive film is wound around the roll surface 54a of the first film forming roll 54 in a state where the first main surface 12a of the flexible substrate 12 is positioned facing the outside (in other words, in a state where the second main surface 12b of the flexible substrate 12 is positioned adjacent to the roll surface 54a).

The first film forming source 56 is spaced apart from the base material 44 to receive film. The first film forming source 56 is arranged to face the first film forming roll 54 in a radial direction (direction perpendicular to an axial direction) of the first film forming roll 54. The first film forming source 56 is a supply source of an electron injection layer material m1. The first film forming source 56 is a known film forming source in a dry film forming method. The first film forming source 56 is, for example, a vapor deposition source, a sputtering source, or the like.

The first shielding part 58 is arranged between the first film forming roll 54 and the first film forming source 56, and is arranged so as to be separated from the base material 44 to receive film wound around the first film forming roll 54. The first shielding part 58 is a member for shielding a part of the electron injection layer material m1 supplied from the first film forming source 56 toward the base material 44 to receive film to deposit the electron injection layer material m1 selectively in a film forming area for the electron injection layer in the base material 44 to receive film.

Figure 10:
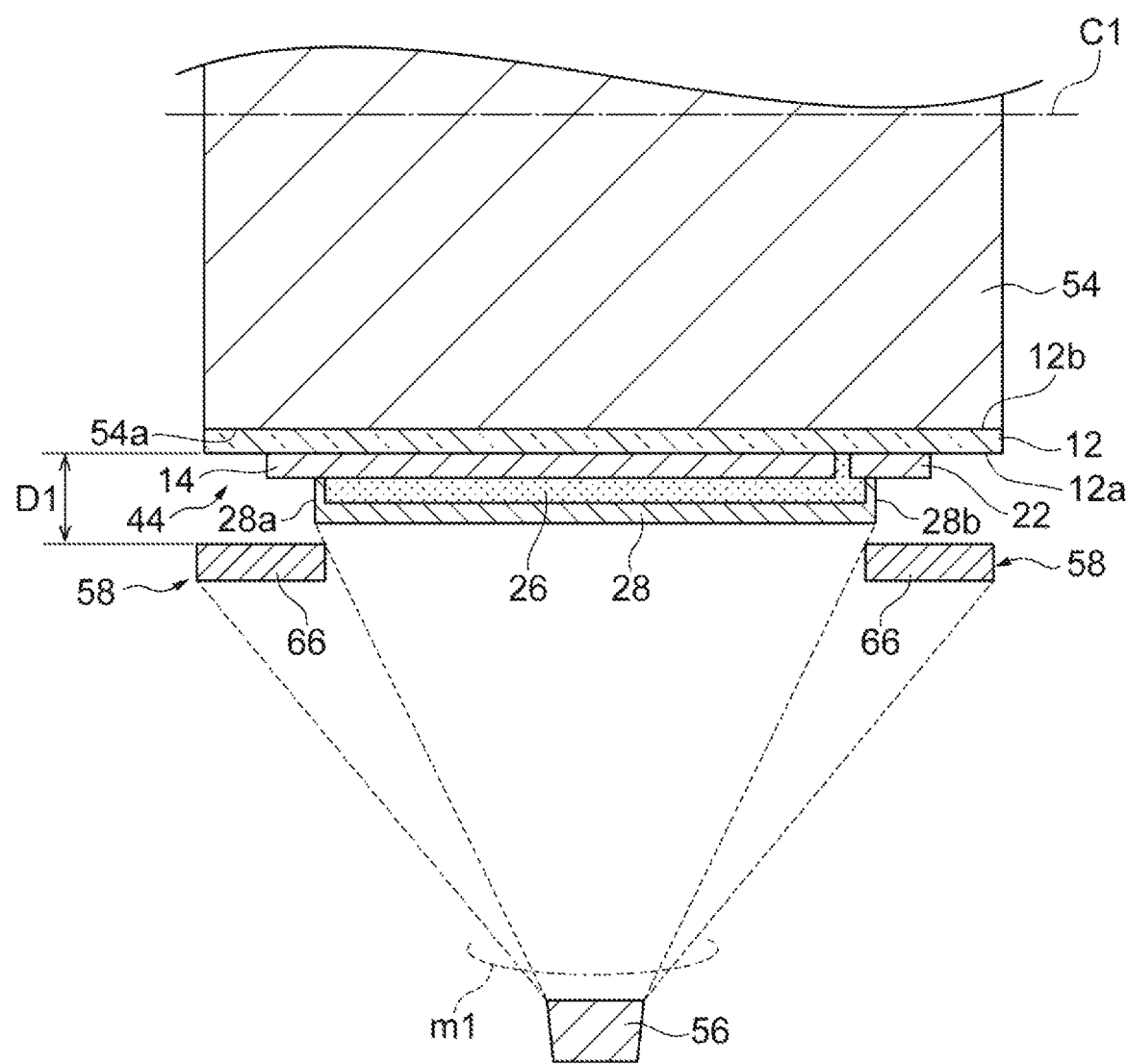
FIG. 10 is a schematic view of a cross-sectional configuration taken along line X-X in FIG. 9.

As illustrated in FIGS. 9 and 10, the first shielding part 58 has two independent first shielding plates 66 making a pair. Examples of a material of the first shielding plate 66 include a metal such as stainless steel, aluminum or the like, or an alloy containing the above metal. Each first shielding plate 66 is curved in a manner similar to the roll surface 54a of the first film forming roll 54, and is fixedly arranged in a conveyance direction of the base material 44 to receive film. A distance D1 between each first shielding plate 66 and the first main surface 12a of the flexible substrate 12 in contact with the roll surface 54a is substantially constant. The distance D1 is a length between the first main surface 12a and a surface of the first shielding plate 66 close to the first main surface 12a (a surface of the first shielding plate 66 facing the first main surface 12a) in a direction perpendicular to the first main surface 12a of the flexible substrate 12. In the present embodiment, the distance D1 corresponds to a distance between the first shielding part 58 and the first main surface 12a of the flexible substrate 12. The direction perpendicular to the first main surface 12a coincides with the radial direction (the direction perpendicular to the axial direction) of the first film forming roll 54 in a state where the flexible substrate 12 is in contact with the roll surface 54a. Here, the distance between the first shielding plate 66 and the flexible substrate 12 has been described, but a definition of the distance between the shielding plate and the flexible substrate also applies to a distance between the other shielding plate (for example, a second shielding plate 68) and the flexible substrate 12.

The distance D1 can be 1 to 160 times the thickness of the flexible substrate 12 included in the base material 44 to receive film. In the base material 44 to receive film that is continuously conveyed, vibrations such as waviness or the like of the base material 44 to receive film sometimes occurs in the radial direction of the first film forming roll 54 in a conveyance process. In this case, when the distance D1 is too small, the first shielding part 58 and the base material 44 to receive film are in contact with each other, such that there is a possibility that damage to the base material 44 to receive film (specifically, the flexible substrate 12 and components on the flexible substrate 12) will occur. On the other hand, when the distance D1 is too large, a shielding effect due to the first shielding part 58 is reduced. If the distance D1 is in the range described above, it is easy to maintain the shielding effect due to the first shielding part 58 and to deposit the electron injection layer material m1 selectively in the film forming area for the electron injection layer while the contact between the first shielding part 58 and the base material 44 to receive film is prevented.

If the distance D1 is 30 to 160 times the thickness of the flexible substrate 12, the thickness of the flexible substrate. 12 is sufficiently smaller than the distance D1. Therefore, the distance D1 can be regarded as the distance between the roll surface 54a and the first shielding plate 66.

Assuming that uniformity of the distance D1 in the conveyance direction of the base material 44 to receive film is $\alpha 1$ [%], $\alpha 1$ is defined by the following Equation 1.

[Math 1]

$$\alpha 1 = \left\{ \frac{D1_{max} - D1_{min}}{(D1_{max} + D1_{min})/2} \right\} \times 100 \quad (1)$$

In Equation 1, $D1_{max}$ is a maximum value in the conveyance direction of the base material 44 to receive film among the distances D1. $D1_{min}$ is a minimum value in the conveyance direction of the base material 44 to receive film among the distances D1.

It is preferable that the uniformity $\alpha 1$ is 40% or less. Since the base material 44 to receive film and the first shielding part 58 are spaced apart from each other, when the distance D1 is non-uniform, non-uniformity occurs in a width of a shielding area due to the first shielding part 58. When the distance D1 is non-uniform, the electron injection layer material m1 intrude between the base material 44 to receive film and the first shielding part 58, such that the electron injection layer material m1 is non-uniformly deposited outside a film forming area of the base material 44 to receive film with a film thickness different from that of a layer formed in the film forming area of the base material 44 to receive film. If the uniformity α1 of the distance D1 is in the range described above, it is easy to form a uniform stripe-like electron injection layer 28 within a range of the film forming area of the base material 44 to receive film.

As illustrated in FIG. 10, the two first shielding plates 66 making a pair are arranged to be spaced apart from each other in the width direction of the flexible substrate 12 (a direction of an axial line C1 of the first film forming roll 54). Therefore, an area between the first shielding plate 66 and the first shielding plate 66 functions as a material passage area of the electron injection layer material m1 supplied from the first film forming source 56 toward the base material 44 to receive film. In other words, a shielding area for preventing the electron injection layer material m1 from being attached onto the flexible substrate 12 is formed by each first shielding plate 66. Since a space between the two first shielding plates 66 is the material passage area, the material passage area can have a curved stripe shape, similar to the roll surface 54a.

The two first shielding plates 66 are arranged so that the electron injection layer material m1 passing between the two first shielding plates 66 is deposited on the film forming area for the electron injection layer in the base material 44 to receive film and the electron injection layer material m1 is prevented from being attached to an area (shielding area) other than the film forming area for the electron injection layer.

Usually, the film forming area for the electron injection layer is set to be wider than the function generating design area A1 that is to be (or is designed to be) the function generating area A in the organic EL device 10 (or the device functional portion 16). In this case, the two first shielding plates 66 are arranged outside the function generating design area A1 in the width direction of the flexible substrate 12.

The second film forming roll 60 has a configuration similar to that of the first film forming roll 54, and a description for the configuration of the second film forming roll 60 is thus omitted. As illustrated in FIGS. 9 and 11, in the second film forming chamber 50, the second film forming roll 60 and the plurality of guide rolls R are arranged so that the base material 44 to receive film is wound around a roll surface 60a of the second film forming roll 60 in a state where the first main surface 12a of the flexible substrate 12 is positioned facing the outside.

The second film forming source 62 is spaced apart from the base material 44 to receive film. The second film forming source 62 is arranged to face the second film forming roll 60 in a radial direction (direction perpendicular to an axial direction) of the second film forming roll 60. The second film forming source 62 is a supply source of a conductive layer material (cathode layer material) m2. The second film forming source 62 is a known film forming source in a dry film forming method. An example of the second film forming source 62 is similar to a case of the first film forming source 56. The second film forming source 62 may be the same as or different from the first film forming source 56.

The second shielding part 64 is arranged between the second film forming roll 60 and the second film forming source 62, and is arranged so as to be separated from the base material 44 to receive film wound around the second film forming roll 60. The second shielding part 64 is a member for shielding a part of the conductive layer material m2 supplied from the second film forming source 62 toward the base material 44 to receive film to deposit the conductive layer material m2 selectively on a film forming area for the conductive layer in the base material 44 to receive film.

Figure 11:
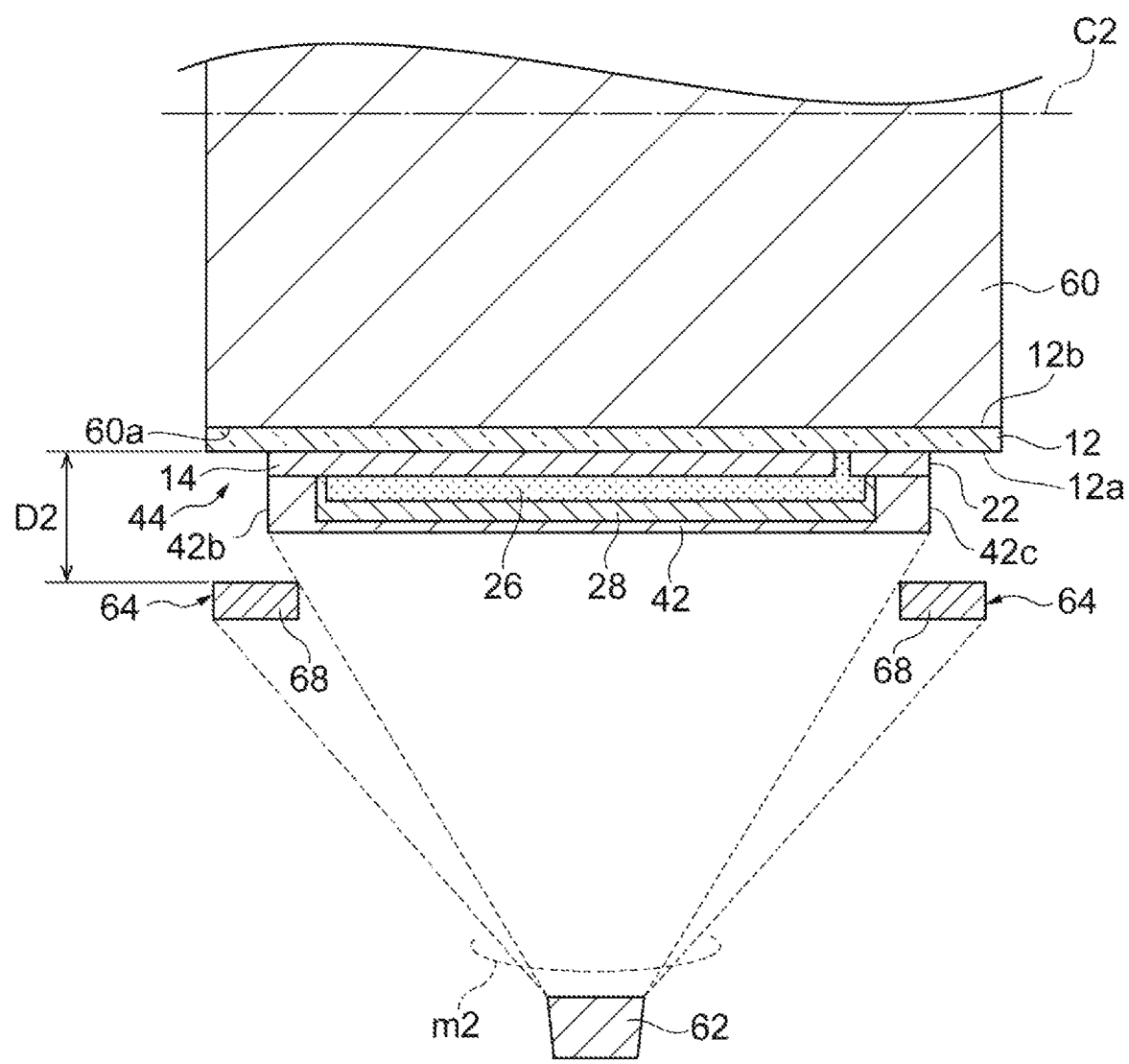
FIG. 11 is a schematic view of a cross-sectional configuration taken along line XI-XI in FIG. 9.

As illustrated in FIGS. 9 and 11, the second shielding part 64 has two independent second shielding plates 68 making a pair. An example of a material of the second shielding plate 68 is similar to a case of the first shielding plate 66. Each second shielding part 64 is curved in a manner similar to the roll surface 60a of the second film forming roll 60, and is fixedly arranged in the conveyance direction of the base material 44 to receive film. A distance D2 between each second shielding plate 68 and the first main surface 12a of the flexible substrate 12 in contact with the roll surface 60a is substantially constant. In the present embodiment, the distance D2 corresponds to a distance between the second shielding part 64 and the first main surface 12a of the flexible substrate 12.

The distance D2 can be 1 to 160 times the thickness of the flexible substrate 12. If the distance D2 is in the range described above, it is easy to maintain a shielding effect due to the second shielding part 64 and to deposit the conductive layer material m2 selectively on the film forming area for the conductive layer, similar to a case of the distance D1, while a contact between the second shielding part 64 and the base material 44 to receive film is prevented. If the distance D2 is 30 to 160 times the thickness of the flexible substrate 12, the thickness of the flexible substrate 12 is sufficiently smaller than the distance D2. Therefore, the distance D2 can be regarded as the distance between the roll surface 60a and the second shielding plate 68. When uniformity α2 of the distance D2 in the conveyance direction of the base material 44 to receive film is defined by Equation 2, it is preferable that the uniformity α2 is 40% or less.

[Math 2]

$$\alpha 2 = \left\{ \frac{D2_{max} - D2_{min}}{(D2_{max} + D2_{min})/2} \right\} \times 100 \qquad (2)$$

In Equation 2, $D2_{max}$ is a maximum value in the conveyance direction of the base material 44 to receive film among the distances D2. $D2_{min}$ is a minimum value in the conveyance direction of the base material 44 to receive film among the distances D2.

If the uniformity α2 is 40% or less, it is easy to form a stripe-like conductive layer 42 having a more uniform width, similar to the case of the distance D1.

As illustrated in FIG. 11, the two second shielding plates 68 making a pair are arranged to be spaced apart from each other in the width direction of the flexible substrate 12 (a direction of an axial line C2 of the second film forming roll 60). Therefore, an area between the two second shielding plates 68 functions as a material passage area of the conductive layer material m2 supplied from the second film forming source 62 toward the base material 44 to receive film. In other words, a shielding area for preventing the conductive layer material m2 from being attached onto the flexible substrate 12 is formed by each second shielding plate 68. Since a space between the two second shielding plates 68 is the material passage area, the material passage area can have a curved stripe shape, similar to the roll surface 60a.

The second shielding plate 68 and the second shielding plate 68 are arranged so that the conductive layer material m2 passing between the second shielding plate 68 and the second shielding plate 68 is deposited on the film forming area for the conductive layer in the base material 44 to receive film and the conductive layer material m2 is prevented from being attached to an area other than the film forming area for the conductive layer.

In the present embodiment, since the conductive layer 42 is formed so a to cover the electron injection layer 28, a width of the film forming area for the conductive layer is greater than that of the film forming area for the electron injection layer, in the width direction of the flexible substrate 12. Therefore, a distance between the second shielding plate 68 and the second shielding plate 68 (a width of the material passage area) is greater than that between the two first shielding plates 66 (a width of the material passage area). In other words, the shielding area due to the second shielding part 64 is set to be narrower than the shielding area due to the first shielding part 58.

Usually, the film forming area for the conductive layer is set to be wider than the function generating design area A1 that is to be (or is designed to be) the function generating area A in the organic EL device 10 (or the device functional portion 16). In this case, the two second shielding plates 68 are arranged outside the function generating design area A1 in the width direction of the flexible substrate 12.

Each of the first shielding part 58 and the second shielding part 64 may be formed as one shielding plate. In this case, an opening portion as a material passage area only has to be formed in the shielding plate.

In the film forming step S12 using the film forming device 46, the base material 44 to receive film is continuously conveyed along the roll surface 54a of the first film forming roll 54 so that the first main surface 12a of the flexible substrate 12 faces outward. At this time, the electron injection layer material m1 is supplied from the first film forming source 56 toward the base material 44 to receive film. Specifically, the electron injection layer material m1 is scattered. A part of the electron injection layer material m1 jumping out of the first film forming source 56 is shielded by the first shielding plates 66. Meanwhile, the electron injection layer material m1 passing through the material passage area between the two first shielding plates 66 is deposited on the base material 44 to receive film, such that the electron injection layer 28 is formed. In the film forming step S12, the electron injection layer 28 is formed while the substrate 36 with an electrode is conveyed in the longitudinal direction of the substrate 36 with an electrode, and the stripe-like electron injection layer 28 is thus formed.

The substrate 36 with an electrode on which the electron injection layer 28 is formed is carried out of the first film forming chamber 48, passes through the connecting part 52, and is then carried into the second film forming chamber 50. In the second film forming chamber 50, the base material 44 to receive film is conveyed along the roll surface 60a of the second film forming roll 60 so that the first main surface 12a of the flexible substrate 12 faces outward, similar to a case of the first film forming chamber 48. At this time, the conductive layer material m2 is supplied from the second film forming source 62 toward the base material 44 to receive film. Specifically, the conductive layer material m2 is scattered. A part of the conductive layer material m2 jumping out of the second film forming source 62 is shielded by the second shielding plates 68. Meanwhile, the conductive layer material m2 passing through the material passage area between the two second shielding plates 68 is deposited on the base material 44 to receive film, such that the conductive layer 42 is formed. In the film forming step S12, the conductive layer 42 is formed while the substrate 36 with an electrode is conveyed in the longitudinal direction of the substrate 36 with an electrode, and the stripe-like conductive layer 42 is thus formed.

The shielding area due to the second shielding part 64 is narrower than the shielding area due to the first shielding part 58. In other words, the material passage area between the two second shielding plates 68 included in the second shielding part 64 is wider than the material passing area between the two first shielding plates 66 included in the first shielding part 58. Therefore, the conductive layer 42 is formed so as to cover the electron injection layer 28.

In the film forming device 46, the base material 44 to receive film wound around the first film forming roll 54 and the second film forming roll 60 is spaced apart from the first shielding part 58 and the second shielding part 64. Therefore, in the film forming step S12, it is possible to form the electron injection layer 28 and the conductive layer 42 adjacent to each other while the base material 44 to receive film is continuously conveyed. Accordingly, a time required for the laminated structure forming step S10 including the film forming step S12 can be shortened, such that productivity of the organic EL device 10 can be improved.

Since the film forming roll, the film forming source, and the shielding part are respectively arranged in order to form the electron injection layer 28 and the conductive layer 42, each of the electron injection layer 28 and the conductive layer 42 can be formed in a desired pattern. For example, since the film forming roll, the film forming source, and the shielding part are provided independently for forming the electron injection layer 28 and the conductive layer 42, each of widths of the electron injection layer 28 and the conductive layer 42 in a traveling direction of the base material 44 to receive film can be adjusted.

The first shielding part 58 and the second shielding part 64 are arranged to be spaced apart from the base material 44 to receive film and are not in contact with the base material 44 to receive film. Therefore, at the time of forming the electron injection layer 28 and the conductive layer 42, damage to the base material 44 to receive film is not generated. As a result, a desired performance (design performance) can be realized in the manufactured organic EL device 10.

The first shielding part 58 and the second shielding part 64 shield the outside of the function generating design area A1. Therefore, the electron injection layer 28 and the conductive layer 42 can be formed so as to include the function generating design area A1, and the device functional portion 16 can thus include the function generating area A. As a result, the device functional portion 16 can properly generate a function.

Next, various modified examples of the present embodiment will be described.

Figure 12:
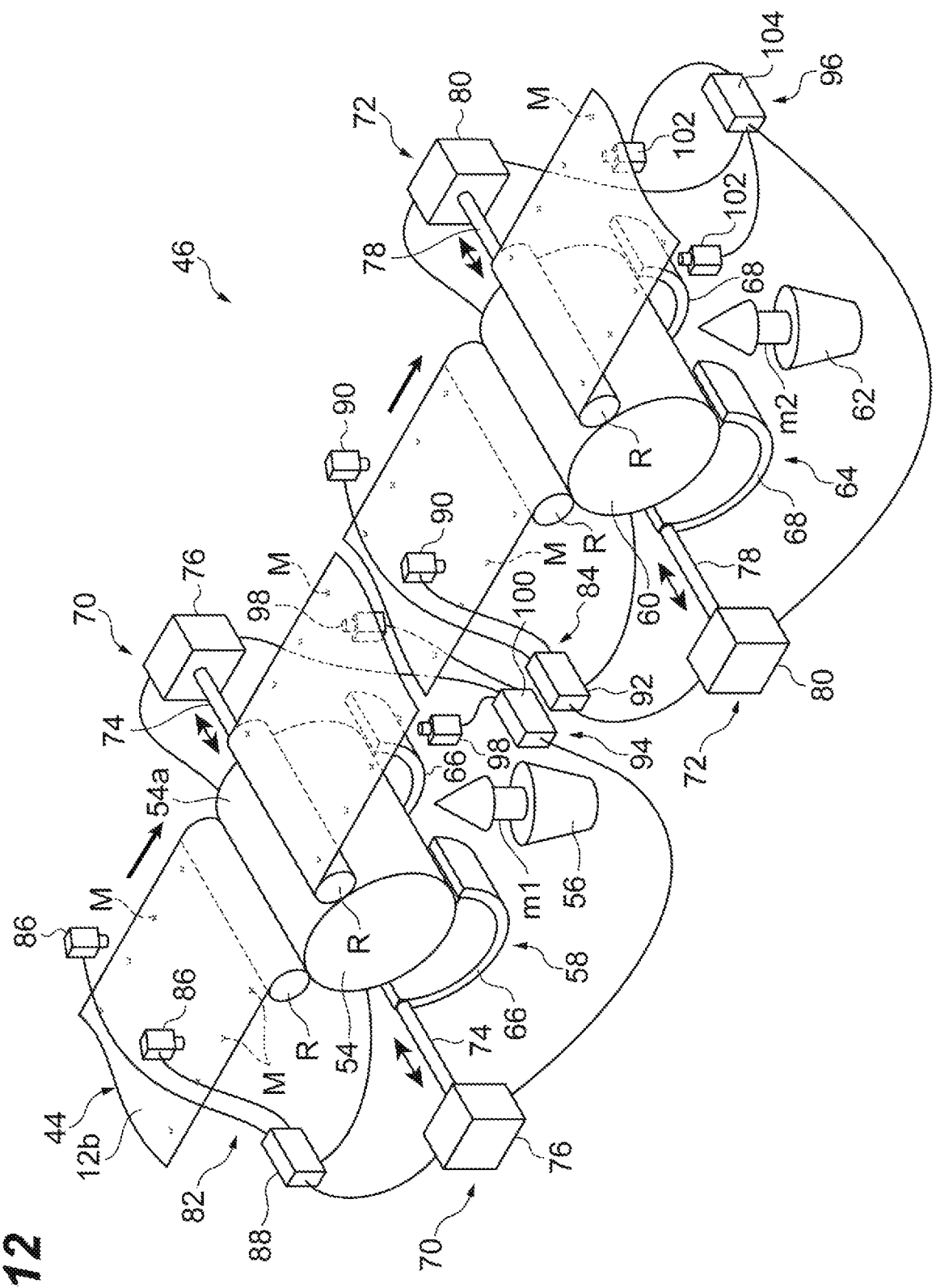
FIG. 12 is a schematic view for describing a modified example of the film forming device.

As illustrated in FIG. 12, the film forming device 46 may further include a first shielding area adjusting mechanism 70 and a second shielding area adjusting mechanism 72. In FIG. 12, the first film forming chamber 48 and the second film forming chamber 50 are not illustrated.

The first shielding area adjusting mechanism 70 is a mechanism that adjusts the shielding area due to the first shielding part 58 in the width direction of the flexible substrate 12. The first shielding area adjusting mechanism 70 includes first cylinders (first shielding plate moving parts) 74 each connected to the first shielding plates 66 and a first control device 76 controlling amounts of expansion and contraction of the respective first cylinders 74. One end of the first cylinder 74 is connected to the first shielding plate 66, and the other end of the first cylinder 74 is connected to the first control device 76. The first control device 76 only has to be arranged at a position that is not affected by the electron injection layer material m1 scattered from the first film forming source 56. The first control device 76 is arranged, for example, outside the first film forming chamber 48. The first control device 76 only has to be configured to be capable of adjusting the amounts of expansion and contraction of the first cylinders 74. The first control device 76 may include a computer.

The first control device 76 controls the expansion and contraction of the first cylinders 74 to change a distance between the first shielding plate 66 and the first shielding plate 66 making a pair, such that the shielding area due to the first shielding part 58 can be adjusted.

Similarly, the second shielding area adjusting mechanism 72 is a mechanism that adjusts the shielding area due to the second shielding part 64 in the width direction of the flexible substrate 12. The second shielding area adjusting mechanism 72 includes second cylinders (second shielding plate moving parts) 78 each connected to the second shielding plates 68 and a second control device 80 controlling the respective second cylinders 78. One end of the second cylinder 78 is connected to the second shielding plate 68, and the other end of the second cylinder 78 is connected to the second control device 80. The second control device 80 only has to be arranged at a position that is not affected by the conductive layer material m2 scattered from the second film forming source 62. The second control device 80 is arranged, for example, outside the second film forming chamber 50. The second control device 80 only has to be configured to be capable of adjusting the amounts of expansion and contraction of the second cylinders 78. The second control device 80 may include a computer.

The second control device 80 controls the expansion and contraction of the second cylinders 78 to change a distance between the second shielding plate 68 and the second shielding plate 68 making a pair, such that a width of the shielding area due to the second shielding part 64 can be adjusted.

In the film forming step S12 using the film forming device 46 including the first shielding area adjusting mechanism 70 and the second shielding area adjusting mechanism 72, a step (shielding area adjusting step) of adjusting the shielding area due to the first shielding part 58 and the shielding area due to the second shielding part 64 in the width direction of the flexible substrate 12 according to the film forming area for the electron injection layer and the film forming area for the conductive layer can be performed before forming each of the electron injection layer 28 and the conductive layer 42. By performing such a shielding area adjusting step, the electron injection layer 28 and the conductive layer 42 can be formed more accurately in the film forming area for the electron injection layer and the film forming area for the conductive layer, respectively. Further, the organic EL device 10 in which widths of the electron injection layer 28 and the conductive layer 42 are different can be manufactured by one film forming device 46.

The first shielding area adjusting mechanism 70 only has to move at least one of the first shielding plate 66 and the first shielding plate 66 in the width direction. Therefore, the first shielding area adjusting mechanism 70 only has to have at least one set of the first cylinder 74 and the first control device 76. Similarly, the second shielding area adjusting mechanism 72 only has to have at least one set of the second cylinder 78 and the second control device 80. The cylinders have been exemplified as shielding plate moving parts moving the shielding plates. However, the shielding plate moving parts are not limited to the cylinders as long as they can move the first shielding plate 66 and the second shielding plate 68 in the width direction.

In a form in which the film forming device 46 includes the first shielding area adjusting mechanism 70 and the second shielding area adjusting mechanism 72, the film forming device 46 may include a first reference positional information acquiring part 82 and a second reference positional information acquiring part 84, as illustrated in FIG. 12.

The first reference positional information acquiring part 82 acquires positional information of the alignment marks M formed on the flexible substrate 12 as reference positional information, and inputs the acquired positional information to the first control device 76. The first reference positional information acquiring part includes first reference position imaging parts 86 and a first reference positional information analysis device 88.

The first reference position imaging parts 86 only has to be arranged at, for example, positions where they can photograph the alignment marks M indicating reference positions, on an upstream side of the first film forming roll 54 in the conveyance direction of the film-deposited base material. An example of the first reference position imaging part 86 is a camera. In FIG. 12, the first reference position imaging parts 86 are arranged above the base material 44 to receive film (arranged adjacent to the second main surface 12b of the flexible substrate 12). However, the first reference position imaging parts 86 may be arranged below the base material 44 to receive film. Usually, the first reference position imaging parts 86 are arranged outside the first film forming chamber 48 in which the first film forming roll 54 is arranged. In this case, the first reference position imaging parts 86 photograph the alignment marks M and the vicinities of the alignment marks M through window portions formed on the first film forming chamber 48. The first reference position imaging parts 86 input acquired image data to the first reference positional information analysis device 88.

The first reference positional information analysis device 88 analyzes the image data photographed by the first reference position imaging parts 86 to calculate the positions of the alignment marks M, and calculates control information of the shielding area due to the first shielding part 58 (specifically, positional information or movement amounts of the first shielding plates 66) on the basis of the positional information of the alignment marks M. The first reference positional information analysis device 88 can have a computer. The first reference positional information analysis device 88 is usually arranged outside the first film forming chamber 48. The first reference positional information analysis device 88 inputs the control information of the shielding area due to the first shielding part 58 to the first control device 76.

Similarly, the second reference positional information acquiring part 84 acquires positional information of the alignment marks M formed on the flexible substrate 12 as reference positional information, and inputs the acquired positional information to the second control device 80. The second reference positional information acquiring part 84 includes second reference position imaging parts 90 and a second reference positional information analysis device 92.

The second reference position imaging parts 90 only has to be arranged at, for example, positions where they can photograph the alignment marks M, on an upstream side of the second film forming roll 60 on a conveyance path of the base material 44 to receive film from the first film forming roll 54 to the second film forming roll 60. An example of the second reference position imaging part 90 is a camera. An arrangement state of the second reference position imaging parts 90 for the base material 44 to receive film and the second film forming chamber 50 can be similar to that of the first reference position imaging parts 86 for the base material 44 to receive film and the first film forming chamber 48. The second reference position imaging parts 90 input acquired image data to the second reference positional information analysis device 92.

The second reference positional information analysis device 92 analyzes the image data photographed by the second reference position imaging parts 90 to calculate the positions of the alignment marks M, and calculates control information of the shielding area due to the second shielding part 64 (specifically, positional information or movement amounts of the second shielding plates 68) on the basis of the positional information of the alignment marks M. The second reference positional information analysis device 92 can have a computer. The second reference positional information analysis device 92 is usually arranged outside the second film forming chamber 50. The second reference positional information analysis device 92 inputs the control information of the shielding area due to the second shielding part 64 to the second control device 80.

In the film forming step S12 using the film forming device 46 including the first reference positional information acquiring part 82 and the second reference positional information acquiring part 84, a step (reference positional information acquiring step) of acquiring the positional information of the alignment marks M as the reference positional information can be performed before the shielding area adjusting step for each of the first shielding part 58 and the second shielding part 64. By performing the reference positional information acquiring step, it is possible to perform the shielding area adjusting step for each of the first shielding part 58 and the second shielding part 64 on the basis of the acquired positional information (reference positional information) of the alignment marks M. Therefore, the electron injection layer 28 and the conductive layer 42 can be more certainly formed in the respective film forming areas. Further, the organic EL device 10 in which at least one of a width of the electron injection layer 28 and a width of the conductive layer 42 is different can be manufactured by one film forming device 46.

The first reference positional information acquiring part 82 and the second reference positional information acquiring part 84 are not limited to the exemplified forms as long as they can acquire the positional information of the alignment marks M.

FIG. 12 exemplifies a form in which the first reference positional information acquiring part 82 includes two first reference position imaging parts 86 for photographing the alignment marks M formed at both end portions of the flexible substrate 12 in the width direction. However, it is enough that the first reference positional information acquiring part 82 includes an imaging part so as to photograph the alignment mark M formed on at least one of the both end portions of the flexible substrate 12 in the width direction. The same applies to the second reference positional information acquiring part 84.

The first reference positional information acquiring part 82 and the second reference positional information acquiring part 84 may not include the first reference positional information analysis device 88 and the second reference positional information analysis device 92, respectively. In this case, the first control device 76 and the second control device 80 may perform analysis functions performed by the first reference positional information analysis device 88 and the second reference positional information analysis device 92, respectively, or the first reference position imaging part 86 and the second reference position imaging part 90 may have analysis functions performed by the first reference positional information analysis device 88 and the second reference positional information analysis device 92, respectively.

In a form in which the film forming device 46 includes the first shielding area adjusting mechanism 70 and the second shielding area adjusting mechanism 72, the film forming device 46 may include a first end portion positional information acquiring part 94 and a second end portion positional information acquiring part 96, as illustrated in FIG. 12.

The first end portion positional information acquiring part 94 acquires positional information of an end portion 28a and an end portion 28b (see FIG. 10) of the electron injection layer 28 formed on the flexible substrate 12, and inputs the positional information to the first control device 76. The first end portion positional information acquiring part 94 includes first end portion imaging parts 98 and a first end portion position analysis device 100.

The first end portion imaging parts 98 only has to be arranged at positions where they can photograph the end portion 28a and the end portion 28b, on the conveyance path of the base material 11 to receive film between the first film forming roll 54 and the second film forming roll 60. In FIG. 12, the first end portion imaging parts 98 are arranged below the base material 44 to receive film (arranged adjacent to the first main surface 12a of the flexible substrate 12). However, the first end portion imaging parts 98 may be arranged above the base material 44 to receive film. The first end portion imaging parts 98 only has to be arranged at positions where films are not directly formed. The first end portion imaging parts 98 can be arranged, for example, outside the first film forming chamber 48 in which the first film forming roll 54 is arranged. In this case, the first end portion imaging parts 98 photograph the vicinities of the end portion 28a and the end portion 28b through the window portions formed on the first film forming chamber 48. The first end portion imaging parts 98 input acquired image data to the first end portion position analysis device 100.

The first end portion position analysis device 100 analyzes the image data photographed by the first end portion imaging parts 98 to calculate the positions of the end portion 28a and the end portion 28b, and calculates control information of the shielding area due to the first shielding part 58 (specifically, positional information or movement amounts of the first shielding plates 66) on the basis of the positional information of the end portion 28a and the end portion 28b. The first end portion position analysis device 100 is usually arranged outside the first film forming chamber 48. The first end portion position analysis device 100 can have a computer. The first end portion position analysis device 100 inputs the control information of the shielding area due to the first shielding part 58 to the first control device 76.

Similarly, the second end portion positional information acquiring part 96 acquires positional information of an end portion 42b and an end portion 42c (see FIG. 11) of the conductive layer 42 formed on the flexible substrate 12, and inputs the positional information to the second control device 80. The second end portion positional information acquiring part 96 includes second end portion imaging parts 102 and a second end portion position analysis device 104.

The second end portion imaging parts 102 only have to be arranged on a downstream side of the second film forming roll 60 on the conveyance path of the base material 44 to receive film and at positions where they can photograph the end portion 42b and the end portion 42c. In FIG. 12, an arrangement state of the second end portion imaging parts 102 for the base material 44 to receive film and the second film forming chamber 50 can be similar to that of the first end portion imaging parts 98 for the base material 44 to receive film and the first film forming chamber 48. The second end portion imaging parts 102 input acquired image data to the second end portion position analysis device 104.

The second end portion position analysis device 104 analyzes the image data photographed by the second end portion imaging parts 102 to calculate the positions of the end portion 42b and the end portion 42c, and calculates control information of the shielding area due to the second shielding part 64 (specifically, positional information or movement amounts of the second shielding plates 68) on the basis of the positional information of the end portion 42b and the end portion 42c. The second end portion position analysis device 104 can have a computer. The second end portion position analysis device 104 is usually arranged outside the second film forming chamber 50. The second end portion position analysis device 104 inputs the control information of the shielding area due to the second shielding part 64 to the second control device 80.

In the film forming step S12 using the film forming device 46 including the first end portion positional information acquiring part 94 and the second end portion positional information acquiring part 96, a step (end portion positional information acquiring step) of acquiring end portion positional information of each of the electron injection layer 28 and the conductive layer 42 can be performed after forming the electron injection layer 28 and the conductive layer 42 through each of the first shielding part 58 and the second shielding part 64. As such, performing the end portion positional information acquiring step, after forming the electron injection layer 28 and again after forming the conductive layer 42, makes it possible to perform a shielding area adjusting step for each of the first shielding part 58 and the second shielding part 64 on the basis of the acquired end portion positional information. That is, by performing the shielding area adjusting step after the end portion positional information acquiring step, it is possible to apply feedback to the shielding areas of the first shielding part 58 and the second shielding part 64.

In order to form the electron injection layer 28 and the conductive layer 42 while continuously conveying the base material 44 to receive film, the electron injection layer material m1 and the conductive layer material m2 are also deposited on the first shielding plates 66 included in the first shielding part 58 and the second shielding plates 68 included the second shielding part 64, respectively. When widths of the first shielding plates 66 and the second shielding plates 68 are changed in this manner, for example, the end portion positions of the electron injection layer 28 and the conductive layer 42 are changed. Even though the end portion positions are changed as such, by adjusting the shielding areas due to the first shielding part 58 and the second shielding part 64 on the basis of the end portion positional information of the electron injection layer 28 and the conductive layer 42 as described above, it is possible to form the electron injection layer 28 and the conductive layer 42 more accurately in the respective film forming areas even though the electron injection layer 28 and the conductive layer 42 are formed while the base material 44 to receive film is continuously conveyed.

The first end portion positional information acquiring part 94 and the second end portion positional information acquiring part 96 are not limited to the exemplified forms as long as they can acquire positional information of target end portions.

In a form illustrated in FIG. 12, a form in which the first end portion positional information acquiring part 94 includes two first end portion imaging parts 98 for photographing both end portions of the electron injection layer 28 in the width direction of the flexible substrate 12 and the vicinities of the both end portions of the electron injection layer 28 is exemplified. However, it is enough that the first end portion positional information acquiring part 94 has an imaging part so as to photograph at least one of the both end portions of the electron injection layer 28 and the vicinity of the at least one of the both end portions. The same applies to the second end portion positional information acquiring part 96.

In the modified example illustrated in FIG. 12, the film forming device 46 includes both of a set of the first reference positional information acquiring part 82 and the second reference positional information acquiring part 84 and a set of the first end portion positional information acquiring part 94 and the second end portion positional information acquiring part 96. However, the film forming device 46 may further include any one of the set of the first reference positional information acquiring part 82 and the second reference positional information acquiring part 84 and the set of the first end portion positional information acquiring part 94 and the second end portion positional information acquiring part 96.

The first end portion position analysis device 100 analyzes the image data photographed by the first end portion imaging parts 98 to calculate the positions of the end portion 28a and the end portion 28b, and calculates control information of the shielding area due to the second shielding part 64 arranged downstream of the first shielding part 58 (specifically, positional information or movement amounts of the second shielding plates 68) on the basis of the positional information of the end portion 28a and the end portion 28b. Therefore, for example, even though the end portion position of the electron injection layer 28 formed on the base material 44 to receive film is changed, by adjusting the shielding area due to the second shielding part 64 on the basis of the positional information of the end portions of the electron injection layer 28 as described above, it is possible to form the conductive layer 42 more accurately in the film forming area of the conductive layer 42 even though the conductive layer 42 is formed while the base material 44 to receive film is continuously conveyed.

In the present embodiment, the organic EL device 10 in which the device functional portion 16 including the light emitting layer 26 and the electron injection layer 28 is arranged between the anode layer 14 and the cathode layer 18 has been exemplified. However, the configuration of the device functional portion is not limited thereto. The device functional portion may have the following configurations. In the following configuration examples, an anode layer and a cathode layer are also described for the purpose of explanation.

(a) (Anode Layer)/Light Emitting Layer/(Cathode Layer)
(b) (Anode Layer)/Hole Injection Layer/Light Emitting Layer/(Cathode Layer)
(c) (Anode Layer)/Hole Injection Layer/Light Emitting Layer/Electron Injection Layer/(Cathode Layer)
(d) (Anode Layer)/Hole Injection Layer/Light Emitting Layer/Electron Transport Layer/Electron Injection Layer/(Cathode Layer)
(e) (Anode Layer)/Hole Injection Layer/Hole Transport Layer/Light Emitting Layer/(Cathode Layer)

(f) (Anode Layer)/Hole Injection Layer/Hole Transport Layer/Light Emitting Layer/Electron Injection Layer/(Cathode Layer)

(g) (Anode Layer)/Hole Injection Layer/Hole Transport Layer/Light Emitting Layer/Electron Transport Layer/Electron Injection Layer/(Cathode Layer)

(h) (Anode Layer)/Light Emitting Layer/Electron Injection Layer/(Cathode Layer)

(i) (Anode Layer)/Light Emitting Layer/Electron Transport Layer/Electron Injection Layer/(Cathode Layer)

A symbol "/" indicates that layers sandwiching the symbol "/" therebetween are laminated adjacent to each other. The configuration shown in the above (h) corresponds to the configuration of the organic EL device 10 in the present embodiment.

Materials of each of the hole injection layer, the hole transport layer, and the electron transport layer can be known materials. Each of the hole injection layer, the hole transport layer, and the electron transport layer may be formed, for example, by a coating method in a manner similar to that of the light emitting layer, or may be formed by a dry film forming method.

In the present embodiment, a form in which two layers of the electron injection layer 28 and the conductive layer 42 are formed in the film forming step S12 has been exemplified. However, the film forming step S12 described in the present embodiment is applicable to a case of forming a plurality of layers while continuously conveying the flexible substrate 12.

The cathode layer 18 can be, for example, a laminate having a plurality of layers. In a case where the cathode layer 18 is the laminate as described above, in the film forming step S12, for example, the method described in the present embodiment may be applied to form the plurality of layers, that are to be the cathode layer 18, by a dry film forming method, while continuously conveying the flexible substrate 12. Alternatively, the method described in the present embodiment may be applied to form the electron injection layer 28 and a plurality of conductive layers that are to be the cathode layer 18. Shielding areas of a plurality of shielding parts for the plurality of conductive layers may be the same as one another or may be different from one another.

The layers that are included in the device functional portion 16 and are to be a plurality of adjacent functional layers may be formed by a dry film forming method by applying the method described in the present embodiment in the film forming step S12. For example, in the film forming step S12, it is possible to form a layer adjacent to the electron injection layer 28 among the functional layers included in the device functional portion 16, the electron injection layer 28, and the conductive layer that is to be the cathode layer 18 while continuously conveying the flexible substrate 12 in the film forming step S12.

A plurality of sets of the anode layers 14 and the extraction electrodes 22 may be formed in the width direction of the flexible substrate 12 on the substrate 36 with an electrode used in the method for manufacturing the organic EL device 10. In other words, there may be multiple rows of the plurality of device forming areas DA in the width direction of the flexible substrate 12. In this case, each of the first shielding part 58 and the second shielding part 64 may have three or more shielding plates along the width direction of the flexible substrate.

The configuration of the organic EL device 10 is not limited to the example illustrated in FIG. 1. The electron injection layer 28 and the cathode layer 18 only has to be formed so as not to be short-circuited with the anode layer 14. Therefore, for example, end portions of the electron injection layer 28 and the cathode layer 18 adjacent to the wall portion 34 may be positioned inside (positioned closer to the extraction electrode 22) a side surface of the light emitting layer 26 adjacent to the wall portion 34. In this case, for example, when the hole portion 42a is formed, the hole portion 42a only has to be formed so that the side surface of the hole portion 42a is positioned inside the light emitting layer 26. Further, the organic EL device 10 may not have the wall portion 34.

In the method for manufacturing the organic EL device 10 conceptually illustrated in FIG. 3, the laminated structure forming step S10 and the sticking step S20 have been continuously performed in the roll-to-roll manner. However, for example, some of a plurality of steps in a step for manufacturing the organic EL device 10 may be performed in the roll-to-roll manner, the flexible substrate may be wound once in a roll shape, and the subsequent steps may then be further performed. Therefore, for example, the flexible substrate may be wound once in the roll shape up to a step before the film forming step S12, and the film forming step may then be performed in the roll-to-roll manner using the flexible substrate wound in the roll shape. In this case, for example, the unwinding part 40A may be installed in the first film forming chamber 48 illustrated in FIG. 9 or upstream of the first film forming chamber 48, and the winding part 40B may be installed in the second film forming chamber 50 or downstream of the second film forming chamber 50.

In the present embodiment, a form in which the organic EL includes the extraction electrode 22 has been described by way of example. However, the organic EL device may not include the extraction electrode. In the organic EL device having this form, the cathode layer functions as the extraction electrode. The organic EL device manufactured by the method for manufacturing an organic EL device may not have the sealing member. In this case, the method for manufacturing the organic EL device does not have the sticking step.

The present invention is not limited to the exemplified various embodiments and modified examples, and is intended to include all modifications defined by the claims and falling within the meaning and scope equivalent to the claims.

In the film forming step, it is enough that first to N-th layers (N is an integer of 2 or more) are sequentially formed on the flexible substrate while the flexible substrate is continuously conveyed. The above embodiment corresponds to a case where N=2. Specifically, in the above embodiment, the first layer corresponds to the electron injection layer 28, and the second layer corresponds to the conductive layer 42 that is to be the cathode layer. Materials of a plurality of layers among materials of the first to N-th layers may be the same as one another. For example, materials of a plurality of adjacent layers among the first to N-th layers may be the same as each other.

In a form in which the first to N-th layers are sequentially formed on the flexible substrate in the film forming step, the film forming device may include first to N-th film forming rolls, first to N-th film forming sources, and first to N-th shielding parts that each correspond to the first to N-th layers. In this case, in the film forming step, by supplying materials of the first to N-th layers from the first to N-th film forming sources to the flexible substrate through the first to N-th shielding parts, which are arranged between each of the first to N-th film forming sources and the flexible substrate so as to be spaced apart from the flexible substrate, while continuously conveying the flexible substrate, the first to N-th layers can be sequentially formed on the flexible substrate.

The first to N-th film forming rolls, the first to N-th film forming sources, and the first to N-th shielding parts can be configured in manners similar to those of the film forming roll, the film forming source, and the shielding part (for example, the first film forming roll, the first film forming source, and the first shielding part) described in the above embodiment except that they are configured to correspond to the first to N-th layers that are to formed, respectively.

A shielding area of at least one shielding part of the first to N-th shielding parts only has to be different from that of at least one other shielding part of the first to N-th shielding parts. Therefore, in a case where an arbitrary layer of the first to N-th layers is called a k-th layer ($2 \leq k \leq N$) and a shielding part corresponding to the k-th layer is called a k-th shielding part, if the shielding area of at least one shielding part of the first to N-th shielding parts is different from that of at least one other shielding part of the first to N-th shielding parts, a shielding area of the k-th shielding part may be the same as or different from that of a k−1-th shielding part. In a case where the shielding area of the k-th shielding part is different from that of the k−1-th shielding part, the shielding area due to the k−1-th shielding part can be narrower than the shielding area due to the k-th shielding part. That is, a film forming area for a k−1-th layer can be wider than that for the k-th layer. Therefore, the k-th layer can be formed so as to cover the k−1-th layer.

In a form in which the film forming device includes the first to N-th shielding parts, assuming that an arbitrary shielding part of the first to N-th shielding parts is an n-th shielding part ($1 \leq n \leq N$) and a distance between a main surface of the flexible substrate and a surface of the n-th shielding part facing the main surface is Dn in a direction (corresponding to a thickness direction) perpendicular to the main surface of the flexible substrate, it is preferable that the distance Dn is 1 to 160 times the thickness of the flexible substrate. If the distance Dn is such a distance, it is easy to prevent contact between the conveyed flexible substrate and first to N-th shielding plates and it is easy to realize shielding effects due to the first to N-th shielding parts.

Assuming that a maximum value and a minimum value of the distance Dn in the conveyance direction of the flexible substrate are $Dn_{max}$ and $Dn_{min}$, respectively, it is preferable that $Dn_{max}$ and $Dn_{min}$ satisfy the following Equation:

$$\{(Dn_{max}-Dn_{min})/((Dn_{max}+Dn_{min})/2)\} \times 100 \leq 40.$$

Accordingly, the n-th layer can be formed more accurately in a corresponding film forming area for the n-th layer through the n-th shielding part.

The first to N-th shielding parts can have a plurality of shielding plates in the width direction of the flexible substrate according to patterns of the first to N-th layers and film forming areas on the flexible substrate. Therefore, for example, the first to N-th shielding parts may have three or more shielding plates in the width direction of the flexible substrate.

The film forming device for sequentially forming the first to N-th layers on the flexible substrate in the film forming step may further include a shielding area adjusting mechanism provided for a predetermined shielding part of the first to N-th shielding parts and configured to adjust a shielding area due to the predetermined shielding part in the width direction of the flexible substrate, in which the predetermined shielding part has a plurality of shielding plates arranged to be spaced apart from each other in an axial direction of a corresponding film forming roll, and the shielding area adjusting mechanism moves at least one of the plurality of shielding plates in the width direction of the flexible substrate. The shielding area adjusting mechanism can have a configuration similar to that of the shielding area adjusting mechanism (for example, the first shielding area adjusting mechanism 70) described with reference to FIG. 12.

In this case, in the film forming step, the shielding area adjusting step described with reference to FIG. 12 can be performed. Therefore, before forming a predetermined layer corresponding to the predetermined shielding part among the first to N-th layers, the shielding area of the predetermined shielding part can be adjusted in accordance with a film forming area of the predetermined layer. As a result, it is easy to form the predetermined layer more correctly in a predetermined film forming area using the predetermined shielding part. The shielding area adjusting mechanism only has to be provided for at least one of the first to N-th shielding parts. For example, in a case where the shielding area adjusting mechanisms are provided so as to correspond to all of the first to N-th shielding parts, it is easy to form the first to N-th layers more accurately in the predetermined film forming areas.

In a form in which the film forming device includes the shielding area adjusting mechanism described above, the film forming device may further include a reference positional information acquiring part configured to acquire the positional information of the alignment mark formed on the flexible substrate as the reference positional information, in which the shielding area adjusting mechanism adjusts the shielding area of the predetermined shielding part on the basis of the reference positional information acquired by the reference positional information acquiring part. The reference positional information acquiring part can have a configuration similar to that of the reference positional information acquiring part (for example, the first reference positional information acquiring part 82) described with reference to FIG. 12.

In this case, in the film forming step, the reference positional information acquiring step described with reference to FIG. 12 can be performed. For example, if positional information of the alignment mark is acquired by the reference positional information acquiring part on an upstream side of a predetermined film forming roll corresponding to the predetermined shielding part, the shielding area for the predetermined layer that is to be formed using a predetermined shielding part can be appropriately adjusted in accordance with the alignment mark. In other words, the predetermined layer can be formed in a predetermined film forming area set in the organic EL device that is to be manufactured.

The reference positional information acquiring part only has to be provided so as to correspond to at least one of the first to N-th film forming rolls. In other words, the reference positional information acquiring part only has to be provided so as to acquire the positional information of the alignment mark on the upstream side of at least one film forming roll. For example, in a case where the reference positional information acquiring parts are provided so as to correspond to all of the first to N-th film forming rolls, if the positional information of the alignment mark on an upstream side of each of the first to N-th film forming rolls is acquired by each reference positional information acquiring part, it is easy to form the first to N-th layers more accurately in the predetermined film forming areas.

Hereinabove, the positional information of the alignment mark formed on the flexible substrate has been described as the reference positional information for adjusting the shielding area. However, it is enough that the reference positional information is information of a position of the flexible substrate, which becomes a reference for adjusting the shielding area. For example, the positional information of the end portion of the flexible substrate (the end portions of the flexible substrate in the width direction) may be the reference positional information. In this case, an operation of the reference positional information acquiring part is similar to that of a case acquiring the positional information of the alignment mark except that the positional information of the end portion of the flexible substrate is acquired instead of the positional information of the alignment mark. In a form in which the position of the end portion of the flexible substrate (the end portions of the flexible substrate in the width direction) is used as the reference positional information, for example, the reference positional information may be used to adjust a position at which a layer such as a light emitting layer or the like is to be formed. In this case, the alignment mark may not be formed on the flexible substrate.

In a form in which the film forming device includes the shielding area adjusting mechanism, the film forming device may further include an end portion positional information acquiring part configured to acquire end portion positional information which is positional information of the end portion of a layer formed through the predetermined shielding part or a layer formed through a shielding part upstream (for example, immediately preceding) of the predetermined shielding part, in which the shielding area adjusting mechanism adjusts the shielding area of the predetermined shielding part on the basis of the end portion positional information acquired by the end portion positional information acquiring part. The end portion positional information acquiring part can have a configuration similar to that of the end portion positional information acquiring part (for example, the first end portion positional information acquiring part 94) described with reference to FIG. 12.

In a form in which the end portion positional information acquiring part acquires the positional information of the end portion of the layer formed through the predetermined shielding part, in the film forming step, the end portion positional information acquiring step described with reference to FIG. 12 can be performed. Therefore, for example, it is possible to form the predetermined layer more accurately in the predetermined film forming area set in the organic EL device that is to be manufactured, even though a material of the predetermined layer is deposited on the shielding plate included in the predetermined shielding part and the width or the like of the shielding plate is changed. In this form, the end portion positional information acquiring part only has to be provided so as to correspond to at least one of the first to N-th film forming rolls. In other words, the end portion positional information acquiring part only has to be provided so as to acquire end portion positional information on a downstream side of at least one film forming roll (and preferably on an upstream side of the next film forming roll). For example, in a case where the end portion positional information acquiring parts are provided so as to correspond to all of the first to N-th film forming rolls, if positional information of the end portion of a layer formed using the immediately preceding film forming roll on a downstream side of each of the first to N-th film forming rolls is acquired by each end portion positional information acquiring part, it is easy to form the first to N-th layers more accurately in the predetermined film forming areas.

A form in which the end portion positional information acquiring part acquires the positional information of the end portion of the layer formed through the shielding part upstream (for example, immediately preceding) of the predetermined shielding part corresponds to, for example, a form in which the shielding area of the second shielding part 64 is adjusted by the second shielding area adjusting mechanism 72 on the basis of the information of the first end portion positional information acquiring part 94 illustrated in FIG. 12.

In the form in which the end portion positional information acquiring part acquires the positional information of the end portion of the layer formed through the shielding part upstream (for example, immediately preceding) of the predetermined shielding part, even though position of the end portion of the layer formed through the shielding part upstream (for example, immediately preceding) of the predetermined shielding part is changed, in a case of forming the predetermined layer corresponding to the predetermined shielding part while continuously conveying the flexible substrate, the predetermined layer can be formed more accurately in the film forming area for the predetermined layer. In this form, the end portion positional information acquiring part only has to be provided so as to correspond to at least one of the first to N−1-th film forming rolls. For example, in a case where the end portion positional information acquiring parts are provided so as to correspond to all of the first to N−1-th film forming rolls, if positional information of the end portion of a layer formed using the immediately preceding film forming roll on a downstream side of each of the first to N−1-th film forming rolls is acquired by each end portion positional information acquiring part, it is easy to form the second to N-th layers more accurately in the predetermined film forming areas.

As described above, in a case where an arbitrary layer among the first to N-th layers is called a k-th layer ($2 \leq k \leq N$) and a film forming roll, a film forming source, and a shielding part corresponding to the k-th layer are called a k-th film forming roll, a k-th film forming source, and a k-th shielding part, respectively, the k-th film forming roll, the k-th film forming source, and the k-th shielding part constitute a film forming unit forming the k-th layer. Film forming units for forming the first to N-th layers may be arranged in different film forming chambers, respectively, or a plurality of film forming units may be arranged in the same film forming chamber.

A form in which the first to N-th layers are formed by the dry film forming method in the film forming device and the film forming step has been described hereinabove, but a method for forming the first to N-th layers is not limited to the dry film forming method.

The organic EL device, which is an example of the organic device, has been described in the above embodiment, but the present invention can be applied to organic devices such as an organic thin film transistor, an organic photodetector, an organic thin film solar cell, an organic sensor, and the like, in addition to the organic EL device.

REFERENCE SIGNS LIST

10 Organic EL device (organic device)
12 Flexible substrate
12a First main surface (main surface)
12b Second main surface 14 Anode layer
16 Device functional portion
18 Cathode layer
20 Laminated structure
28 Electron injection layer (first layer)
28a, 28b End portion
42 Conductive layer (second layer)
42b, 42c End portion
46 Film forming device
54 First film forming roll
54a Roll surface
56 First film forming source
58 First shielding part
60 Second film forming roll
60a Roll surface
62 Second film forming source
64 Second shielding part
66 First shielding plate
68 Second shielding plate
70 First shielding area adjusting mechanism (shielding area adjusting mechanism)
72 Second shielding area adjusting mechanism (shielding area adjusting mechanism)
82 First reference positional information acquiring part (reference positional information acquiring part)
84 Second reference positional information acquiring part (reference positional information acquiring part)
94 First end portion positional information acquiring part (end portion positional information acquiring part)
96 Second end portion positional information acquiring part (end portion positional information acquiring part)
A Function generating area
A1 Function generating design area
C1, C2 Axial line

The invention claimed is:

1. A method for manufacturing an organic device, comprising:
    a step of forming a laminated structure on a first electrode layer formed on a main surface of a flexible substrate extending in one direction, the laminated structure including a device functional portion including at least one functional layer and a second electrode layer,
    wherein the step of forming the laminated structure includes a step of forming first to N-th layers (N is an integer of 2 or more) on the first electrode layer while continuously conveying the flexible substrate on which the first electrode layer is formed,
    in the step of the forming the first to N-th layers, the first to N-th layers are sequentially formed on the first electrode layer by selectively supplying materials of the first to N-th layers from first to N-th film forming sources to film forming areas for the first to N-th layers while shielding partial areas on the main surface due to first to N-th shielding parts arranged between the first to N-th film forming sources and the flexible substrate,
    the first to N-th shielding parts are fixed in a conveyance direction of the flexible substrate in a state of being spaced apart from the flexible substrate,
    a shielding area on the main surface due to at least one shielding part of the first to N-th shielding parts is different from a shielding area due to at least one other shielding part of the first to N-th shielding parts, and
    wherein a shielding area due to a k-th shielding part (2≤k≤N) of the first to N-th shielding parts is narrower than a shielding area due to a k-1-th shielding part.

2. The method for manufacturing an organic device according to claim 1, wherein in the step of forming the first to N-th layers, the first to N-th layers are formed while the flexible substrate is wound around roll surfaces of first to N-th film forming rolls.

3. The method for manufacturing an organic device according to claim 1,
    wherein in the step of forming the first to N-th layers, each of the first to N-th layers is formed by a dry film forming method.

4. The method for manufacturing an organic device according to claim 1,
    wherein the first to N-th shielding parts shield an outside of a function generating design area which is an area that is to form a function generating area of the device functional portion on the flexible substrate.

5. The method for manufacturing an organic device according to claim 1,
    wherein in a direction perpendicular to the main surface of the flexible substrate, a distance Dn between a surface of an n-th shielding part (1≤n≤N) of the first to N-th shielding parts that faces the main surface and the main surface is 1 to 160 times a thickness of the flexible substrate.

6. The method for manufacturing an organic device according to claim 1,
    wherein $Dn_{max}$ and $Dn_{min}$ satisfy a following Equation:

$$\{(Dn_{max}-Dn_{min})/((Dn_{max}+Dn_{min})/2)\}\times 100 \leq 40$$

where in a direction perpendicular to the main surface of the flexible substrate, a maximum value of a distance Dn between the surface of an n-th shielding part (1≤n≤N) of the first to N-th shielding parts that faces the main surface and the main surface is $Dn_{max}$ and a minimum value of the distance Dn is $Dn_{min}$.

7. The method for manufacturing an organic device according to claim 1,
    wherein a predetermined shielding part of the first to N-th shielding parts has a plurality of shielding plates in a width direction of the flexible substrate, and
    the plurality of shielding plates are spaced apart from each other.

8. The method for manufacturing an organic device according to claim 7,
    wherein the step of forming the first to N-th layers includes a step of adjusting a shielding area by moving at least one of the plurality of shielding plates in the width direction of the flexible substrate.

9. The method for manufacturing an organic device according to claim 8,
    wherein the step of forming the first to N-th layers includes a step of acquiring reference positional information of the flexible substrate before the step of adjusting the shielding area, and
    in the step of adjusting the shielding area, the shielding area is adjusted on the basis of the reference positional information.

10. The method for manufacturing an organic device according to claim 8,
    wherein the step of forming the first to N-th layers includes a step of acquiring end portion positional information which is positional information of an end portion of a layer formed through the predetermined shielding part or a layer formed through a shielding part upstream of the predetermined shielding part, and
    after the step of acquiring the end portion positional information, a step of adjusting a shielding area of the predetermined shielding part on the basis of the end portion positional information is performed.

11. A film forming device that forms first to N-th layers (N is an integer of 2 or more) on a flexible substrate extending in one direction while the flexible substrate is continuously conveyed, the film forming device comprising:
- first to N-th film forming sources arranged to be spaced apart from the flexible substrate and configured to supply materials of the first to N-th layers onto the flexible substrate; and
- first to N-th shielding parts being spaced apart from the flexible substrate, provided between the first to N-th film forming sources and the flexible substrate, and configured to shield a part of a supply of the materials of the first to N-th layers from the first to N-th film forming sources onto the flexible substrate,
- wherein the first to N-th film forming sources are sequentially arranged from an upstream side to a downstream side in a conveyance direction of the flexible substrate,
- the first to N-th shielding parts are fixed in the conveyance direction of the flexible substrate,
- a shielding area of at least one shielding part of the first to N-th shielding parts is different from a shielding area of at least one other shielding part of the first to N-th shielding parts, and
- wherein a shielding area due to a k-th shielding part ($2 \leq k \leq N$) of the first to N-th shielding parts is narrower than a shielding area due to a k-1-th shielding part.

12. The film forming device according to claim 11, further comprising
- first to N-th film forming rolls (N is an integer of 2 or more) arranged to face the first to N-th film forming sources, respectively, and having roll surfaces around which the flexible substrate is wound.

13. The film forming device according to claim 11, further comprising
- a shielding area adjusting mechanism provided for a predetermined shielding part of the first to N-th shielding parts and configured to adjust a shielding area due to the predetermined shielding part in a width direction of the flexible substrate,
- wherein the predetermined shielding part has a plurality of shielding plates arranged to be spaced apart from each other in an axial direction of a corresponding film forming roll, and
- the shielding area adjusting mechanism moves at least one of the plurality of shielding plates in the width direction of the flexible substrate.

14. The film forming device according to claim 13, further comprising
- a reference positional information acquiring part configured to acquire reference positional information of the flexible substrate,
- wherein the shielding area adjusting mechanism adjusts the shielding area of the predetermined shielding part on the basis of the reference positional information acquired by the reference positional information acquiring part.

15. The film forming device according to claim 13, further comprising
- an end portion positional information acquiring part configured to acquire end portion positional information which is positional information of an end portion of a layer formed through the predetermined shielding part or a layer formed through a shielding part upstream of the predetermined shielding part,
- wherein the shielding area adjusting mechanism adjusts the shielding area of the predetermined shielding part on the basis of the end portion positional information acquired by the end portion positional information acquiring part.

* * * * *